(12) United States Patent
Cok

(10) Patent No.: US 12,389,544 B2
(45) Date of Patent: Aug. 12, 2025

(54) METHOD OF MAKING A STACKED ELECTRONIC COMPONENT

(71) Applicant: X-Celeprint Limited, Dublin (IE)

(72) Inventor: Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 0 days.

(21) Appl. No.: 17/950,359

(22) Filed: Sep. 22, 2022

(65) Prior Publication Data

US 2023/0017617 A1    Jan. 19, 2023

Related U.S. Application Data

(63) Continuation of application No. 17/146,295, filed on Jan. 11, 2021, now Pat. No. 11,490,519.

(51) Int. Cl.
*H01S 4/00* (2006.01)
*H01L 25/065* (2023.01)
(Continued)

(52) U.S. Cl.
CPC ......... *H05K 1/182* (2013.01); *H01L 25/0657* (2013.01); *H05K 1/0243* (2013.01);
(Continued)

(58) Field of Classification Search
CPC ......... H01L 24/24; H01L 24/32; H01L 24/82; H01L 25/0652; H01L 25/16; H01L 25/50;
(Continued)

(56) References Cited

U.S. PATENT DOCUMENTS

| 4,677,015 A * | 6/1987 | Ito ............................ B41M 3/12 428/209 |
| 5,864,177 A | 1/1999 | Sundstrom |

(Continued)

FOREIGN PATENT DOCUMENTS

WO    WO-2021/037808 A2    3/2021

OTHER PUBLICATIONS

Hamer, J.W. et al., AMOLED Displays Using Transfer-Printed Integrated Circuits (63.2), Society for Information Display International Symposium Digest of Technical Papers, 40(1):947-950 (2009).
(Continued)

*Primary Examiner* — Paul D Kim
(74) *Attorney, Agent, or Firm* — Choate, Hall & Stewart LLP; Michael D. Schmitt

(57) ABSTRACT

A stacked electronic component comprises a stack of three or more print layers. Each print layer has an area less than any print layers beneath the print layer in the stack. Each print layer comprises a dielectric layer and a functional layer disposed on the dielectric layer. The functional layer comprises an exposed conductive portion that is not covered with a dielectric layer of any of the print layers and each exposed conductive portion is nonoverlapping with any other exposed conductive portion. A patterned electrode layer is coated on at least a portion of the stack and defines one or more electrodes. Each electrode of the one or more electrodes in electrical contact with an exclusive subset of the exposed conductive portions. The functional layers can be passive conductors forming capacitors, resistors, inductors, or antennas, or active layers forming electronic circuits.

7 Claims, 29 Drawing Sheets

(51) Int. Cl.
  *H05K 1/02* (2006.01)
  *H05K 1/11* (2006.01)
  *H05K 1/16* (2006.01)
  *H05K 1/18* (2006.01)

(52) U.S. Cl.
  CPC ............ *H05K 1/0284* (2013.01); *H05K 1/11* (2013.01); *H05K 1/162* (2013.01); *H05K 1/165* (2013.01); *H05K 1/167* (2013.01)

(58) Field of Classification Search
  CPC ............ H01L 23/66; H01L 2223/6677; H01L 2225/06524; H01L 2225/06568; H01L 2225/0657; H01L 2225/06593; H01L 2224/24145; H01L 2224/24265; H01L 2224/32145; H01L 2924/19041; H01L 2924/19042; H01L 2924/19043; H01L 2924/19104; H05K 1/0243; H05K 1/0284; H05K 1/11; H05K 1/162; H05K 1/165; H05K 1/167; H05K 1/182; H05K 2201/09263; H05K 2201/09763
  See application file for complete search history.

(56) References Cited

U.S. PATENT DOCUMENTS

| | | | |
|---|---|---|---|
| 6,551,857 B2 | 4/2003 | Leedy | |
| 7,622,367 B1 | 11/2009 | Nuzzo et al. | |
| 8,022,421 B2 | 9/2011 | Hsueh et al. | |
| 8,035,115 B2 | 10/2011 | Ogihara et al. | |
| 8,129,256 B2 | 3/2012 | Farooq et al. | |
| 8,506,867 B2 | 8/2013 | Menard | |
| 8,546,900 B2 | 10/2013 | Oganesian | |
| 8,722,458 B2 | 5/2014 | Rogers et al. | |
| 9,000,577 B2 | 4/2015 | Droege et al. | |
| 9,865,600 B2 | 1/2018 | Bower et al. | |
| 10,050,351 B2 | 8/2018 | Bower et al. | |
| 10,332,868 B2 | 6/2019 | Cok et al. | |
| 10,714,374 B1 | 7/2020 | Cok et al. | |
| 11,152,395 B1 | 10/2021 | Carr et al. | |
| 2003/0024731 A1 | 2/2003 | Nordal et al. | |
| 2003/0070569 A1* | 4/2003 | Bulthaup | B82Y 10/00 101/127 |
| 2007/0290321 A1 | 12/2007 | Sundstrom | |
| 2016/0071651 A1 | 3/2016 | Kurosawa | |
| 2016/0093600 A1 | 3/2016 | Bower et al. | |
| 2018/0042110 A1 | 2/2018 | Cok | |
| 2019/0165207 A1 | 5/2019 | Kim et al. | |
| 2019/0385885 A1 | 12/2019 | Trindade | |
| 2020/0212262 A1 | 7/2020 | Jang et al. | |
| 2021/0001655 A1* | 1/2021 | Fujishige | B41M 1/06 |
| 2021/0082715 A1 | 3/2021 | Rubloff et al. | |
| 2022/0225508 A1 | 7/2022 | Cok | |

OTHER PUBLICATIONS

Kim, S. et al., Microstructured elastomeric surfaces with reversible adhesion and examples of their use in deterministic assembly by transfer printing, PNAS, 107(40):17095-17100, (2010).

* cited by examiner

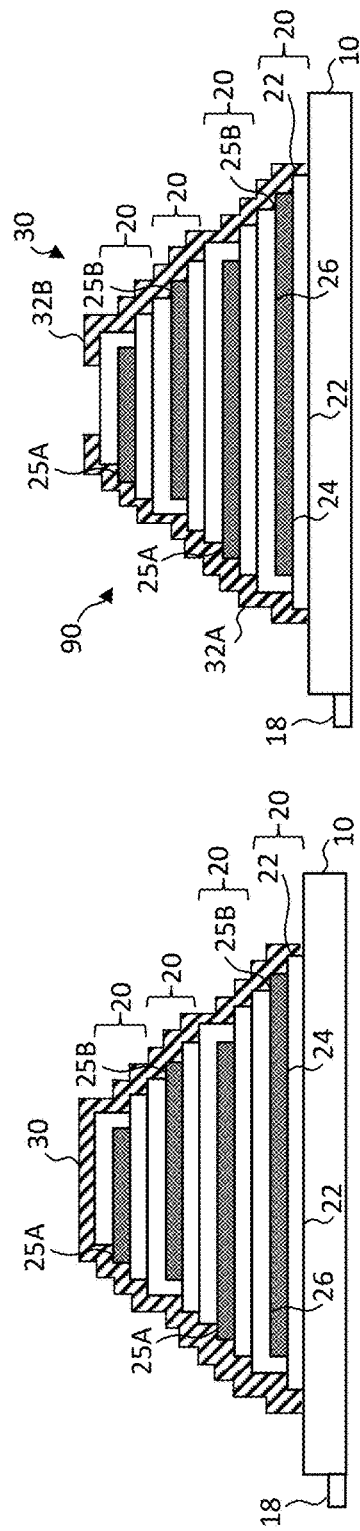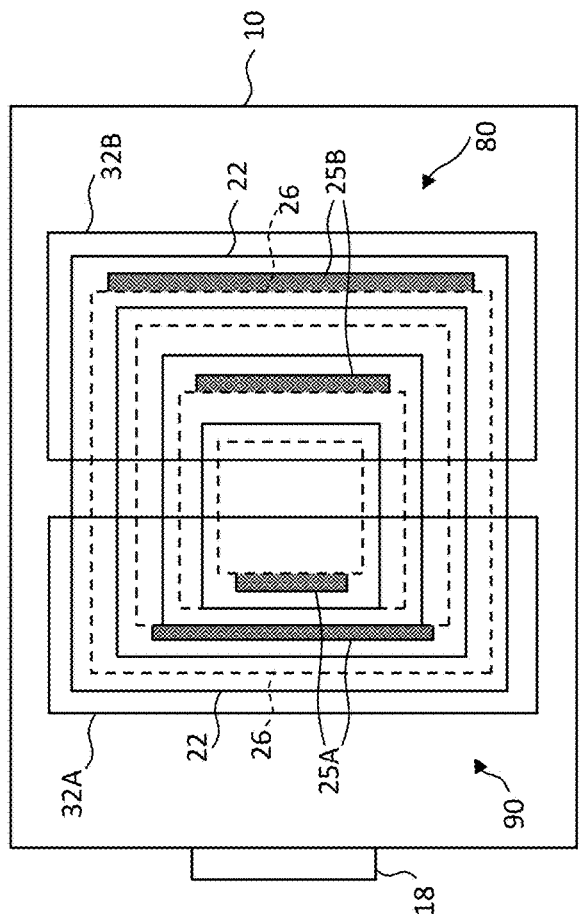
FIG. 1H
FIG. 1G
FIG. 1I

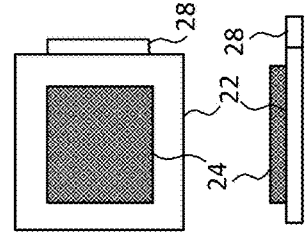
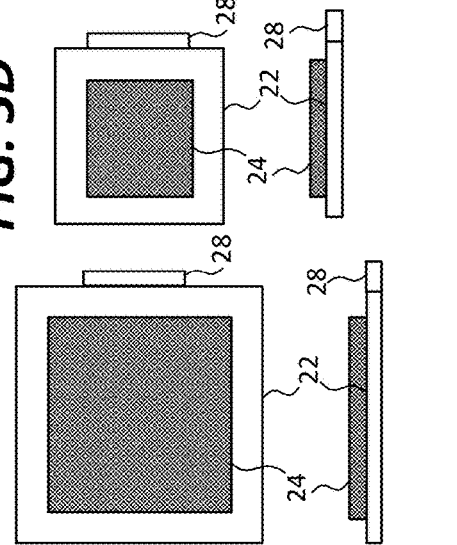
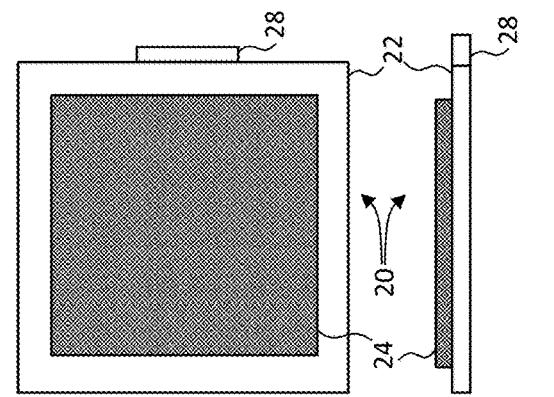
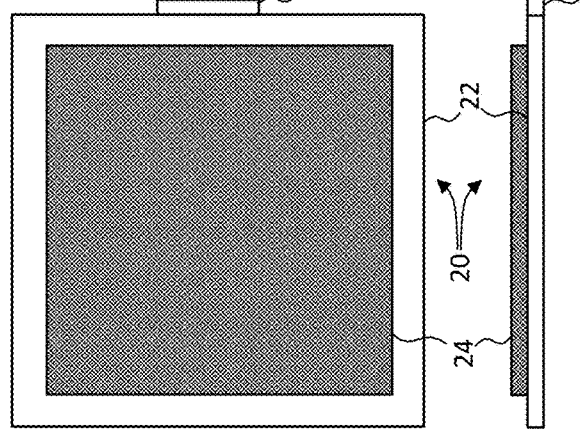
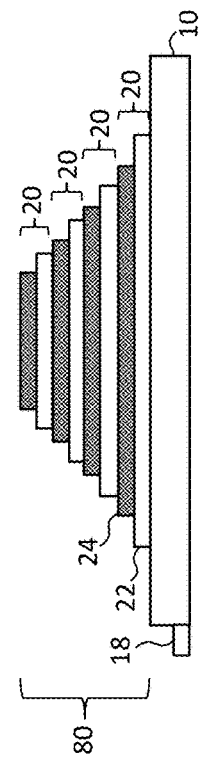
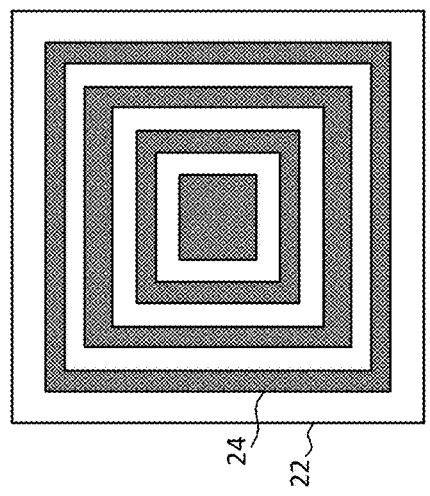

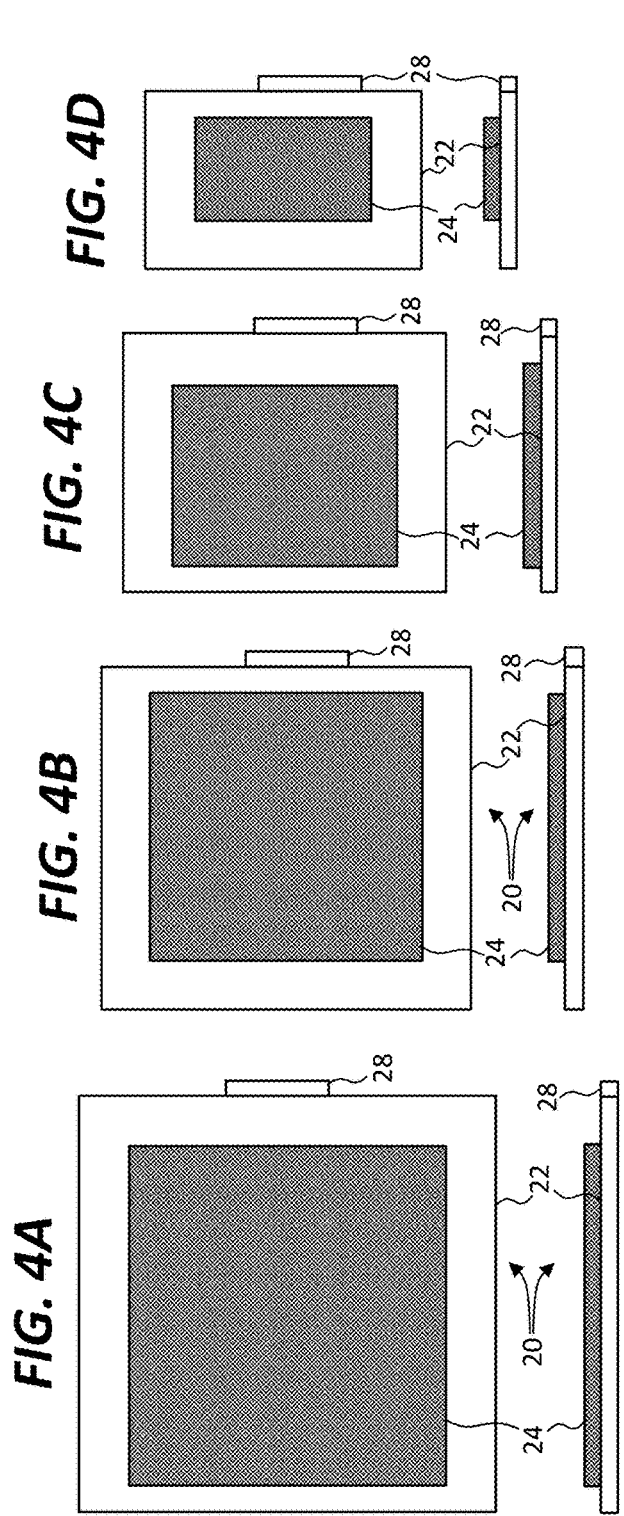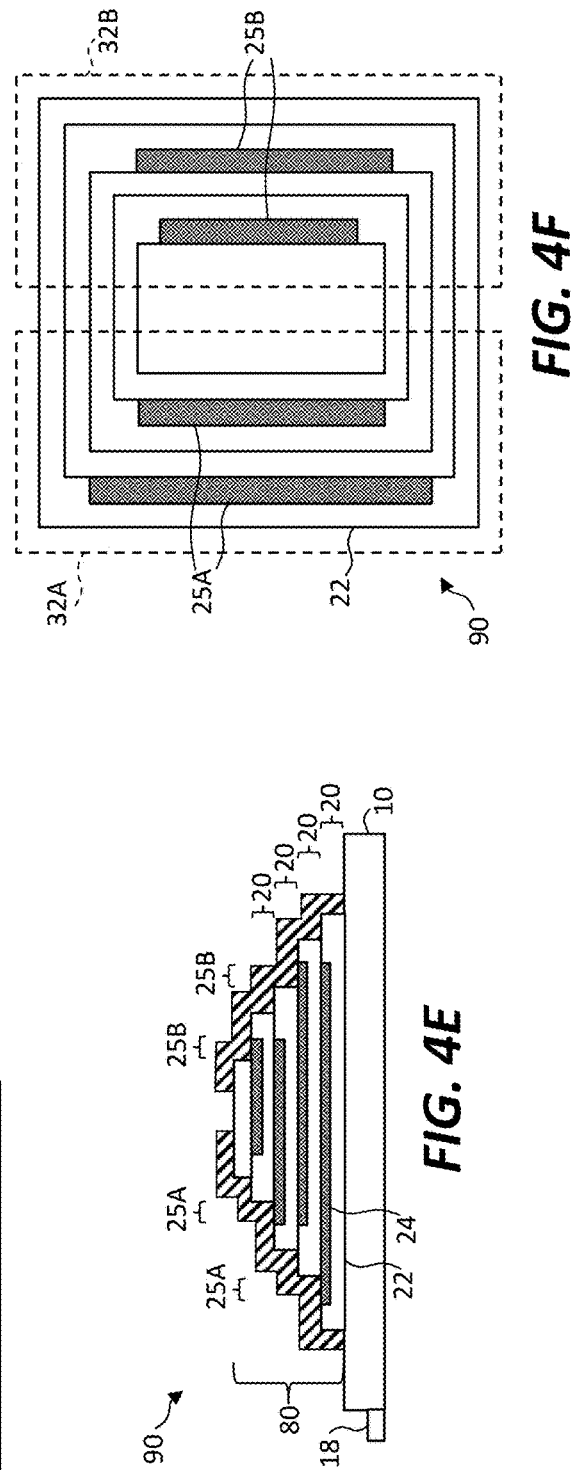

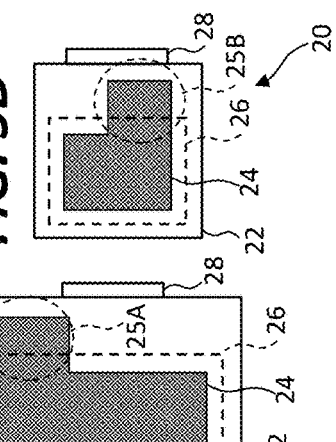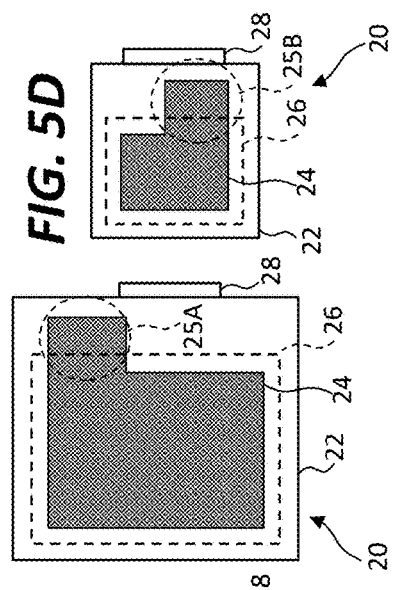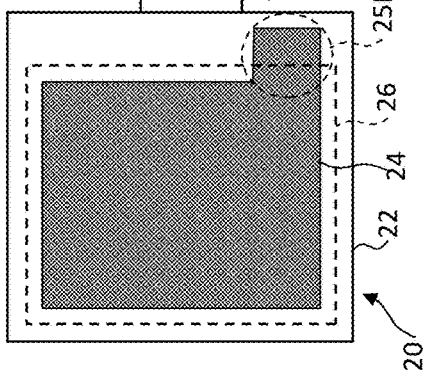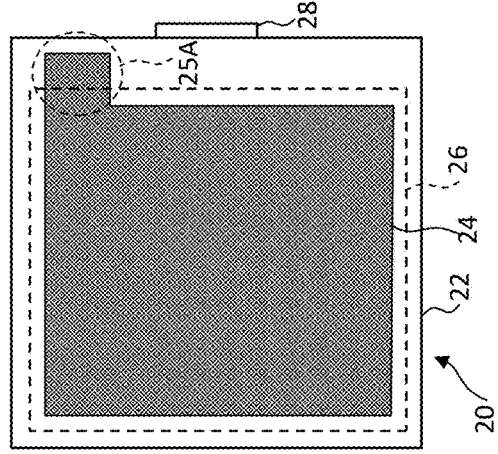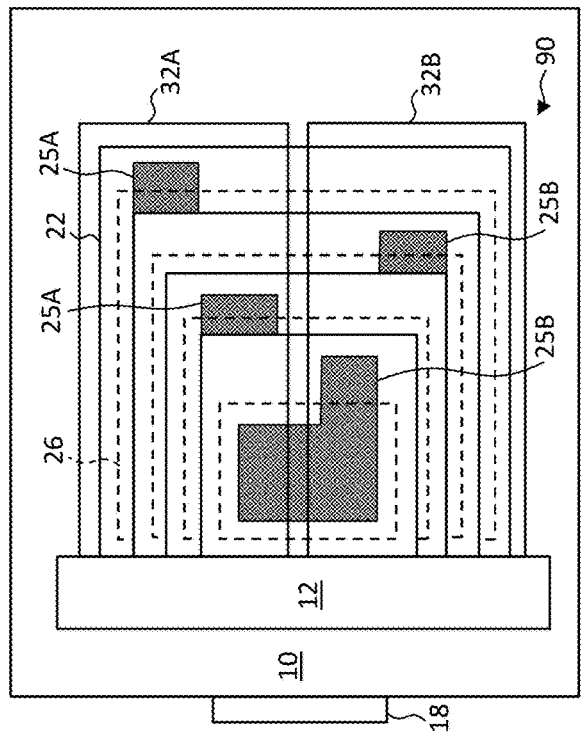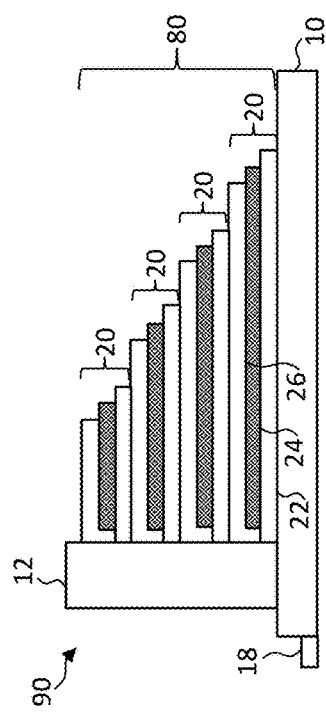

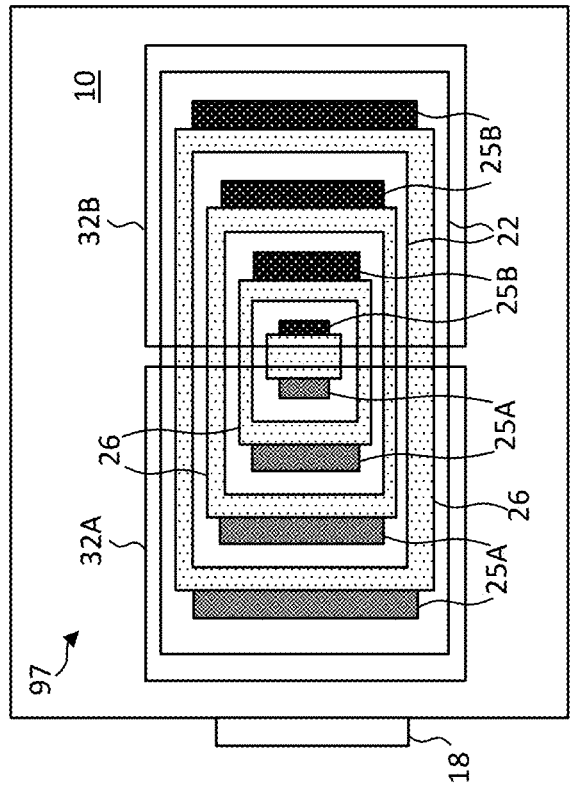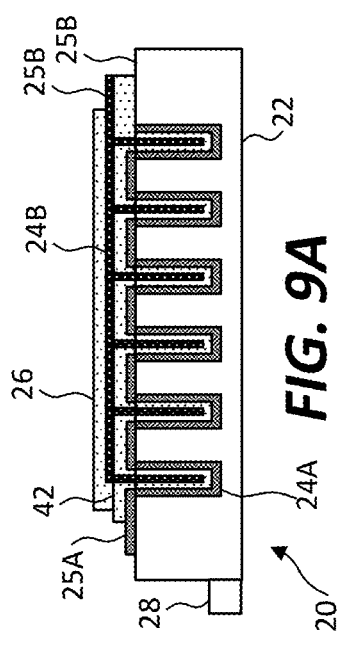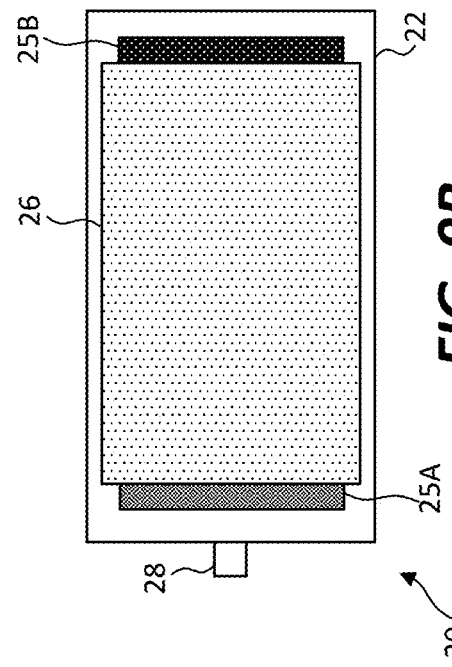

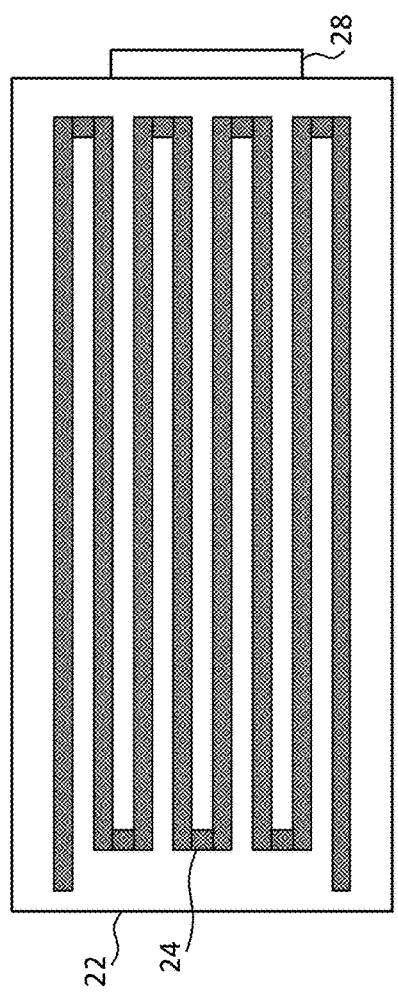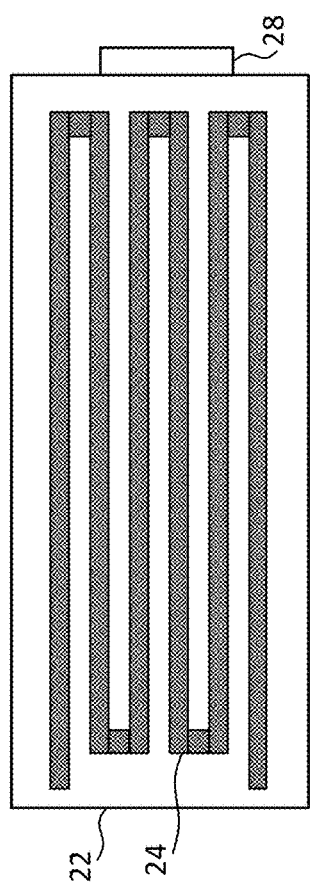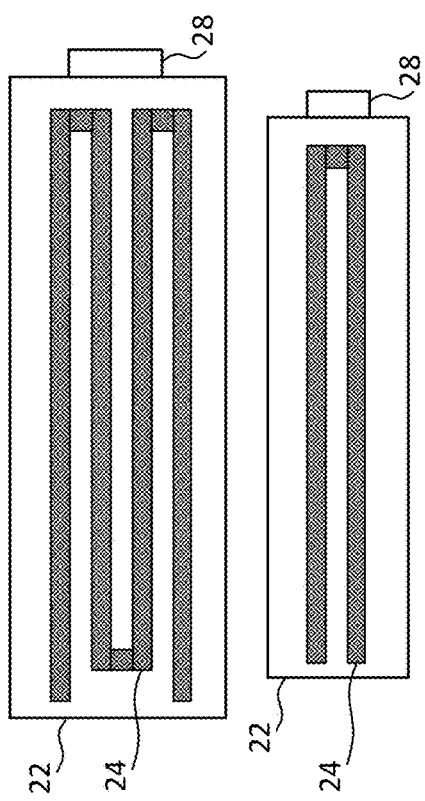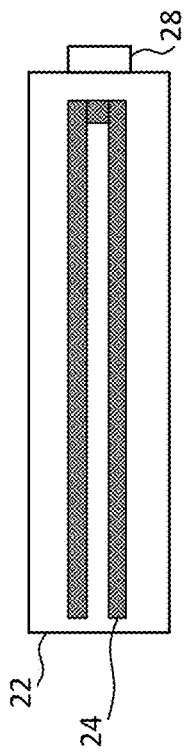
FIG. 11A
FIG. 11B
FIG. 11C
FIG. 11D

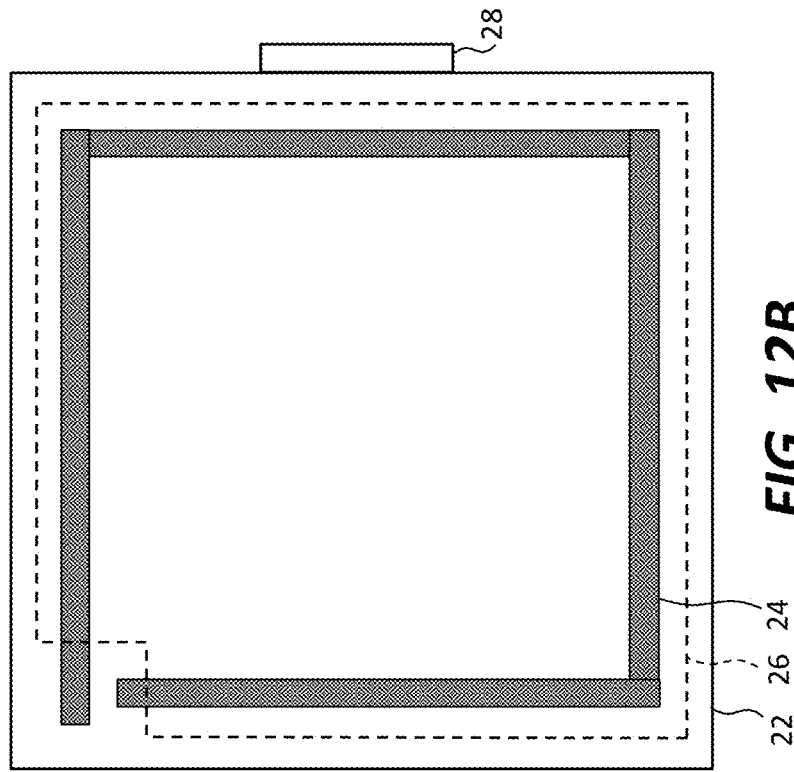
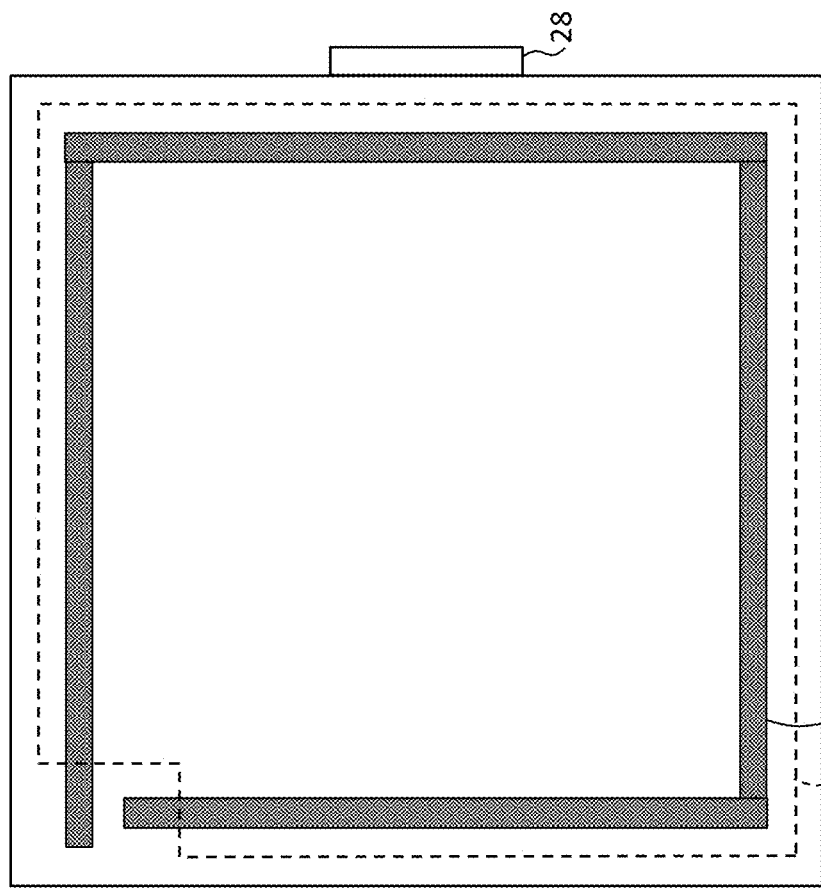
FIG. 12A
FIG. 12B

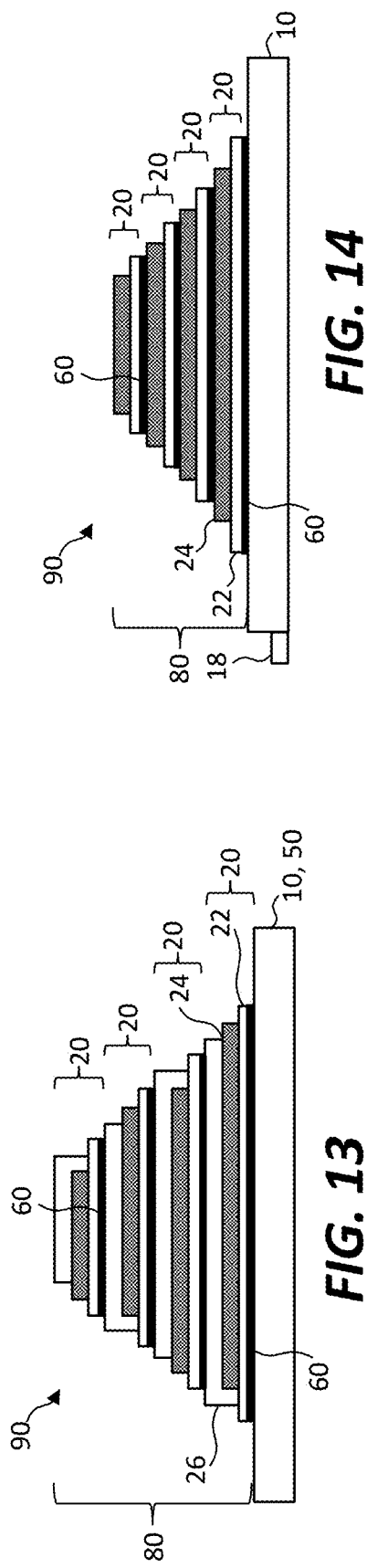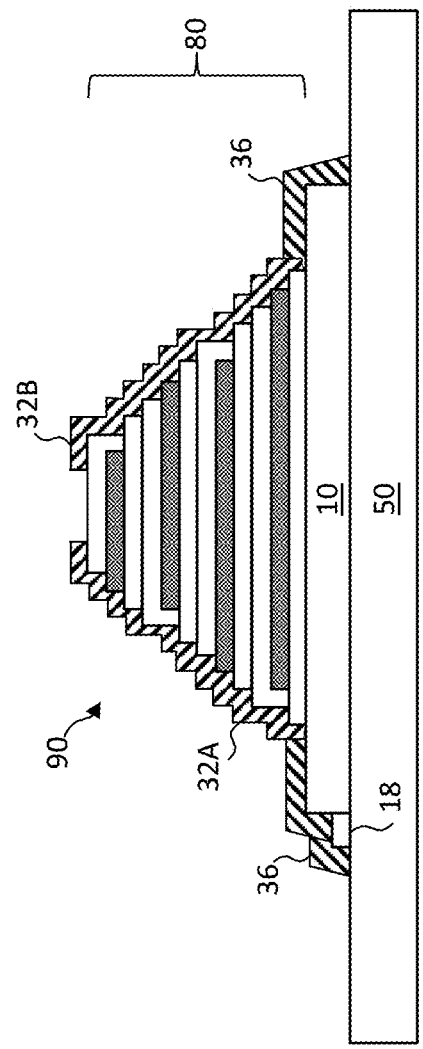

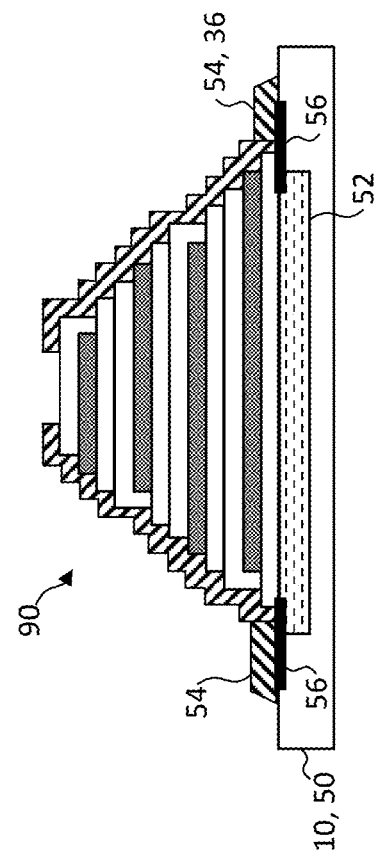
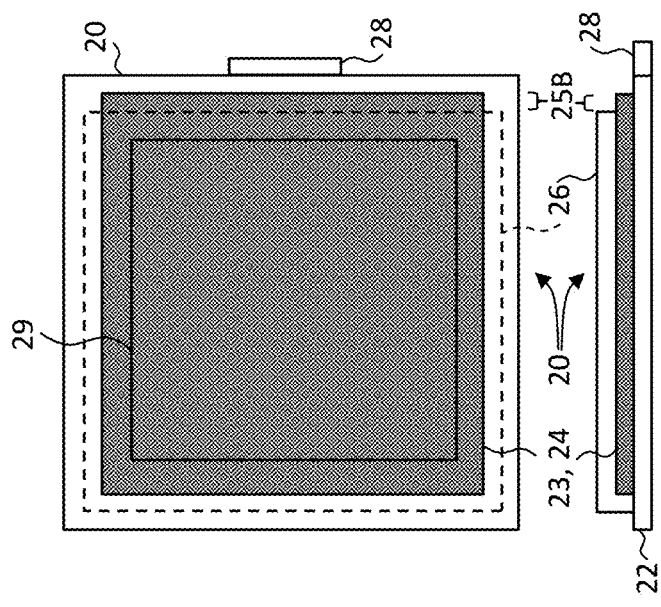
FIG. 22
FIG. 23

METHOD OF MAKING A STACKED ELECTRONIC COMPONENT

PRIORITY APPLICATION

This application is a continuation of U.S. patent application Ser. No. 17/146,295, filed on Jan. 11, 2021, now U.S. Pat. No. 11,490,519, the disclosure of which is hereby incorporated by reference herein in its entirety.

CROSS REFERENCE TO RELATED APPLICATIONS

Reference is made to U.S. Pat. No. 10,050,351, entitled Multilayer Printed Capacitors, filed Jun. 18, 2015 by Bower et al and to U.S. Patent Application Publication No. 2018/0042110, entitled Printable 3D Electronic Structure, filed Aug. 3, 2017 by Cok, the disclosures of which are incorporated herein by reference in their entirety.

TECHNICAL FIELD

The present disclosure relates generally to structures and methods for making stacked electronic components using micro-transfer printing.

BACKGROUND

Electronic circuits typically use a combination of passive and active electronic components. Passive electronic components include capacitors, resistors, and inductors (e.g., coils) that affect the flow of current, store electrical charge, or form electromagnetic fields. Active electronic components include transistors and diodes incorporating semiconductor materials that can switch or amplify electronic current. For electronic systems comprising printed circuit boards, integrated circuits and stacked electronic components can be assembled on the printed circuit boards using methods such as pick-and-place. However, such techniques for assembling passive components are limited in the form factors that can be assembled due to limitations on the size of components that can be manipulated and placement accuracy.

Micro-electronic systems can be highly integrated and include active micro-components with sizes of only a few nanometers integrated in a layer of a semiconductor substrate, for example as are found in integrated circuits useful in computers and portable electronic devices such as cellular telephones. Although the size of the active components can be very small, comparably sized passive components have much smaller functional parameters. For example, smaller resistors have a smaller resistance and smaller capacitors have a smaller capacitance. However, in many electronic circuits, even if the active components are reduced in size, the desired resistance or capacitance of passive components in the electronic circuits remains the same. In consequence, the passive components can be relatively large compared to the active components, inhibiting a desired reduction in size of the electronic circuits and associated micro-electronic systems. There is a need, therefore, for smaller passive electronic components with larger functional parameters suitable for integration into micro-electronic devices such as integrated circuits. There is also a need for active electronic devices made in smaller structures.

To increase density in electronic systems further, some electronic systems use stacked integrated circuits to reduce power, improve switching speed, and increase density, for example as taught in U.S. Pat. No. 6,551,857. However, these structures require packaged integrated circuits and thermal diffusion bond layers, increasing the size and interconnection complexity of the structure. Other methods use stacked die layers with through interconnects, for example as discussed in U.S. Pat. No. 9,000,577, but construction of through interconnections, for example with through silicon vias, is difficult and expensive. Other methods employ interface wafers with through silicon vias to interconnect bonded active-circuitry wafers (U.S. Pat. No. 8,129,256) or integrated circuits (U.S. Pat. No. 8,546,900) but these are limited in the number of layers that can be interconnected.

Stacked capacitor structures are discussed in U.S. Pat. No. 5,864,177, but these are each interconnected with bond wires, use internal vias to connect the plates in each capacitor, and the layers are constructed using expensive photolithography. U.S. Patent Publication No. 2007/0290321 discloses chip and wire and flip-chip-compatible die stack capacitors ("stack caps") that comprise separately fabricated multi-layer sections that are bonded together. Each stack cap is wire bonded to a host substrate and comprises conductive adhesive layers adhering two successively smaller single-layer capacitors (SLCs) each having a dielectric layer with metalized top and bottom surfaces. The metalized top surfaces are wire bonded to the host substrate, providing two power connections and a ground connection. However, wire bonding is a slow and relatively expensive connection process unsuited to mass production in large volumes, the number of functional layers in each stack cap is limited as is the number of stack caps, thereby limiting the capacitance of the die stack capacitor, and conductive adhesives can be less conductive than desired, reducing the performance and functional parameters of the die stack capacitor.

A method for transferring active micro-components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

U.S. Pat. No. 10,050,351 discloses a micro-capacitor comprising stacked substrates assembled by micro-transfer printing. In embodiments of this design, multiple substrates of identical size are stacked in an offset configuration to expose electrical connections to each substrate in the stack. Each substrate can comprise an array of vertical capacitors in a substrate with a common connection. Wire bonds connect the plates to form a three-dimensional capacitor. However, wire bonding can be a relatively slow and cumbersome method for connecting electronic devices.

U.S. Patent Publication No. 2018/0042110 discloses a stack of micro-devices that are electrically connected with connection posts. The micro-devices can be, among other things, capacitors but the micro-devices are relatively large compared to the capacitor itself and require repeated photolithographic processing steps.

There is a need, therefore, for structures and methods that enable electronic micro-components with increased functional parameters and reduced size that are suitable for incorporation into micro-electronic systems.

SUMMARY

The present disclosure provides, among other embodiments, structures, materials, and methods for a stacked electronic component comprising a stack of three or more print layers. Each print layer in the stack of three or more print layers has an area less than any of the print layers that are beneath the print layer in the stack. Each of the print layers comprises a dielectric layer and a functional layer disposed on the dielectric layer. The functional layer comprises an exposed conductive portion that is not covered with a dielectric layer of any of the print layers and the exposed conductive portion of each of the print layers is nonoverlapping with the exposed conductive portion of any other of the print layers. A patterned electrode layer is coated on at least a portion of the stack and defines one or more electrodes. Each electrode of the one or more electrodes is in electrical contact with an exclusive subset of the exposed conductive portions of each of an exclusive subset of the print layers. Multiple electrical connections to a common exposed conductive portion of a print layer are a common electrode. According to some embodiments, the stacked electronic component is a passive electronic component. According to some embodiments, the stacked electronic component is an active electronic component. In some configurations, the functional layer is exclusively an electrical conductor, exclusively a resistive electrical conductor, an epitaxial layer, or an active circuit. The stacked electronic component can be a multi-layer active circuit, a capacitor, a resistor, an inductor, or an antenna.

According to some embodiments, each and every print layer of each of the stack of three or more print layers is electrically connected exclusively by the patterned electrode layer. According to some embodiments, less than all of the print layers of the stack of three or more print layers is electrically connected by the patterned electrode layer. The print layer of each of the stack of three or more print layers can be, but is not necessarily, adhered to an adjacent print layer with a layer of adhesive. The dielectric layer can be the layer of adhesive.

In some configurations, the dielectric layer is a bottom dielectric layer and each print layer of the stack of three or more print layers comprises a top dielectric layer disposed on the functional layer on a side (surface) of the functional layer opposite the bottom dielectric layer. The top dielectric layer can cover the functional layer except for the exposed conductive portion. The top dielectric layer can be an inorganic dielectric or a layer of adhesive that adheres adjacent print layers of the stack of three or more print layers together.

According to some embodiments, the patterned electrode layer defines only two electrodes. According to some embodiments, the one or more electrodes in the patterned electrode layer are disposed in a common layer. According to some embodiments, the one or more electrodes electrically connect fewer than all of the exposed conductive portions.

According to some embodiments, the exposed conductive portions of at least two print layers of the stack of three or more print layers are electrically connected by one or more functional-layer connectors (e.g., functional-layer electrical connections) that are physically and spatially separate from the one or more electrodes and electrically separate from the one or more electrodes except through the functional layers (e.g., are not directly connected). The one or more functional-layer connectors can be disposed in a common layer, for example in a common coated and patterned metal layer disposed and patterned in common steps. The one or more functional-layer connectors can be disposed in a common layer with the one or more electrodes, for example in a common coated and patterned metal layer disposed and patterned in common steps. The one or more functional-layer connectors can electrically connect the functional layers in series or in parallel. The functional-layer connectors can electrically connect the exposed conductive portions of adjacent print layers of the stack of three or more print layers.

According to some embodiments, the print layers of the stack of three or more print layers are shaped as a polygon, for example within the limits of a manufacturing process. In some embodiments, all of the exposed conductive portions of the print layers are disposed on opposing sides (opposing edges) of the polygon. In some embodiments, each of the exposed conductive portions of the print layers is disposed on three sides (three edges) of the polygon. In some embodiments, each of the exposed conductive portions of the print layers is disposed on one side (one edge) of the polygon. In some embodiments, all of the exposed conductive portions are disposed on one side (one edge) of the polygon. According to some embodiments, the print layers of the stack of three or more print layers are substantially rectangular or the dielectric layer has a rectangular shape with an extended tab and the exposed conductive portion is disposed on the tab. In some embodiments, none of the exposed conductive portions electrically connected to a first electrode of the one or more electrodes are disposed spatially between the exposed conductive portions electrically connected to a second electrode of the one or more electrodes different from the first electrode in a direction orthogonal to the stack. In some embodiments, some of the exposed conductive portions electrically connected to a first electrode of the one or more electrodes are disposed spatially between the exposed conductive portions electrically connected to a second electrode of the one or more electrodes different from the first electrode in a direction orthogonal to the stack.

Each functional layer in the stack can be a passive electrical conductor that is a plate (e.g., a coated surface of a polygon filled with an electrical conductor), a serpentine conductor (e.g., a wire), or a conductor within and close to at least most of a perimeter of a polygon (e.g., a wire extending around most of, and near to the edge of, the polygon, for example closer to the perimeter than a center of the polygon). Each functional layer can be an epitaxial layer, for example a photolithographically processed epitaxial layer comprising electrically connected transistors or diodes, or both transistor and diodes. Each functional layer can be semiconductor substrate, for example a photolithographically processed semiconductor substrate comprising electrically connected transistors or diodes, or both.

In some embodiments, a stacked electronic component of the present disclosure comprises an insulating layer disposed over the stack of three or more print layers and vias formed in the insulating layer. One or more electrodes can be electrically connected to the exposed conductive portions through the vias. In some embodiments, a stacked electronic component of the present disclosure is encapsulated, for example by an organic or inorganic dielectric. In some embodiments, a stacked electronic component of the present disclosure is planarized, for example by an organic or inorganic dielectric.

According to some embodiments, a stacked electronic component comprises an alignment structure and the print layers of the stack of three or more print layers are one or more of adjacent to, aligned by, and in contact with the alignment structure. The alignment structure can align the stack and the print layers in one dimension or in two dimensions.

In some embodiments, the functional layer of one or more print layers of the stack of three or more print layers is a vertical capacitor layer.

In some embodiments, each print layer of the stack of three or more print layers comprises a broken (e.g., fractured) or separated tether. In some embodiments, the functional layer of one or more print layers of the stack of three or more print layers comprises a broken (e.g., fractured) or separated tether.

According to some embodiments of the present disclosure, a stacked electronic component comprises a component substrate comprising a component print layer, the component print layer comprising a component dielectric layer and a component functional layer disposed on the component dielectric layer. Print layers are disposed on the component substrate. The component functional layer comprises a component substrate exposed conductive portion that is not covered with a dielectric layer of any of the print layers disposed on the component substrate and an electrode of the one or more electrodes is in electrical contact with the component substrate exposed conductive portion. The component print layer can be a print layer in the stack of print layers.

According to some embodiments, a stacked electronic component is a micro-component. An area of the stacked electronic component can be no greater than 40,000 $\mu m^2$, a thickness of each print layer can be no greater than one micron, two microns, five microns, or 10 microns, and a thickness of the stack can no greater than 5 microns, 10 microns, 20 microns, 30 microns, 50 microns, or 100 microns.

The patterned electrode layer can cover no less than 5% of an area of the stacked electronic component, no less than 5% of an area of the stacked electronic component, no less than 10% of an area of the stacked electronic component, no less than 25% of an area of the stacked electronic component, no less than 50% of an area of the stacked electronic component, no less than 75% of an area of the stacked electronic component, no less than 85% of an area of the stacked electronic component. The area of the stacked electronic component can be the area in a horizontal direction orthogonal to a vertical direction of the stack of print layers.

According to embodiments of the present disclosure, a method of making a stacked electronic component comprises providing one or more print-layer source wafers comprising print layers, providing a component source substrate, transfer printing a first print layer from a print-layer source wafer of the one or more print-layer source wafers onto the component source substrate, transfer printing a second print layer from a print-layer source wafer of the one or more print-layer source wafers onto the first print layer, transfer printing a third print layer from a print-layer source wafer of the one or more print-layer source wafers onto the second print layer thereby increasing the number of print layers in the stack of print layers, coating the stack with an electrode layer, and patterning the electrode layer to define one or more electrodes. Each electrode of the one or more electrodes can be in electrical contact with each exposed conductive portion of an exclusive subset of the print layers in the stack. Each print layer comprises a dielectric layer and a functional layer disposed on the dielectric layer. Each functional layer can comprise an exposed conductive portion that is not covered with a dielectric layer of any of the print layers, the second print layer has a smaller area than the first print layer and the third print layer has a smaller area than the second print layer, and each exposed conductive portion of the print layers in the stack is nonoverlapping with any other exposed conductive portion.

Some embodiments comprise successively transfer printing print layers having successively smaller areas from a print-layer source wafer of the one or more print-layer source wafers onto the stack to increase the number of print layers in the stack. Each functional layer of each print layer comprises an exposed conductive portion that is not covered with a dielectric layer of any of the print layers. The one or more print-layer source wafers can be a single, common print-layer source wafer, a plurality of substantially identical print-layer source wafers, or a plurality of print-layer source wafers, at least some of which are different from each other. Some methods comprise rotating a print layer with respect to another different print layer while transfer printing the print layer onto or over the other print layer.

The component substrate can be disposed on or in a component source wafer and methods of the present disclosure can comprise transfer printing the component to a target substrate. In some methods, the component substrate is a target substrate. Some methods comprise coating the stack with an insulating layer and forming vias in the insulating layer to expose the exposed conductive portions.

Patterning the electrode layer can comprise forming one or more functional-layer connectors that each electrically connect the exposed conductive portions of at least two print layers in the stack and are physically and spatially separate from the one or more electrodes so that the one or more electrodes electrically connect fewer than all of the exposed conductive portions in the stack.

According to some embodiments of the present disclosure, an active electronic component comprises a stack of three or more print layers. Each print layer in the stack of three or more print layers has an area less than any of the print layers that are beneath the print layer in the stack. Each print layer in the stack of three or more print layers comprises a dielectric layer and an epitaxial layer disposed on or in the dielectric layer. The epitaxial layer can comprise an exposed conductive portion that is not covered with a dielectric layer of any of the print layers of the stack of three or more print layers and the exposed conductive portion of each of the print layers is nonoverlapping with the exposed conductive portion of any other of the print layers. A patterned electrode layer can be coated on at least a portion of the stack, the patterned electrode layer defining one or more electrodes, each electrode of the one or more electrodes in electrical contact with the exposed conductive portion of each of an exclusive subset of the print layers. The dielectric layer can be a layer of adhesive. The epitaxial layer can be a semiconductor substrate, or a layer of epitaxy disposed on (e.g., grown on) the dielectric layer. In some embodiments, the print layers in the stack of three or more print layers are active print layers.

Some active-print-layer embodiments of the present disclosure can also comprise one or more passive print layers that each comprise a dielectric layer and a functional layer disposed on the dielectric layer. The functional layer comprises an electrical conductor, for example a patterned electrical conductor, and an exposed conductive portion that is not covered with a dielectric layer of any of the print layers in the stack of three or more print layers. Each exposed conductive portion is nonoverlapping with any other exposed conductive portion or any active print layer or passive print layer in the stack of three or more print layers.

According to some embodiments, a passive electronic component comprises a stack of three or more print layers, each print layer in the stack having an area less than any of the print layers that are beneath the print layer in the stack of three or more print layers. Each of the print layers comprises a dielectric layer and a conductive layer disposed on or in the dielectric layer. The conductive layer can be as substantially conductive as the materials and processing methods for the conductive layer allow or can be a substantially resistive conductor with a desired resistance defined by the materials and processing methods for the conductive layer. The conductive layer comprises an exposed conductive portion that is not covered with a dielectric layer of any of the print layers in the stack of three or more print layers and the exposed conductive portion of each of the print layers is nonoverlapping with the exposed conductive portion of any other of the print layers. A patterned electrode layer is coated on at least a portion of the stack, the patterned electrode layer defines one or more electrodes, and each electrode of the one or more electrodes is in electrical contact with the exposed conductive portions of each of an exclusive subset of the print layers.

The present invention provides, inter alia, structures and methods that enable the construction of passive or active electronic micro-components with a reduced footprint over a substrate and with increased functional parameters or circuit complexity and size. In certain embodiments, the assembly and electrical interconnection process for the passive electronic micro-components is simple and inexpensive requiring fewer process steps than known alternative methods and provides a robust, three-dimensional electronic structure that is expandable in a variety of configurations and circuits.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1G is a cross section of the structure of FIGS. 1E and 1F coated with an electrode layer according to illustrative embodiments of the present disclosure;

FIG. 1H is a cross section of the structure of FIG. 1G with the electrode layer patterned to define electrodes according to illustrative embodiments of the present disclosure;

FIG. 1I is a cut-away plan view corresponding of the cross section of FIG. 1H according to illustrative embodiments of the present disclosure;

FIGS. 3A-3D are plan views and cross sections of different-area print layers of a micro-assembled electronic component according to illustrative embodiments of the present disclosure;

FIG. 3E is a plan view and FIG. 3F is a corresponding cross section of the print layers of FIGS. 3A-3D micro-assembled on a component substrate according to illustrative embodiments of the present disclosure;

FIGS. 4A-4D are plan views and cross sections of different print layers of a micro-assembled electronic component according to illustrative embodiments of the present disclosure;

FIG. 4E is a cross section and FIG. 4F is a corresponding cut-away plan view of the print layers of FIGS. 4A-4D micro-assembled on a component substrate with patterned electrodes according to illustrative embodiments of the present disclosure;

FIGS. 5A-5D are plan views and cross sections of different print layers of an electronic component according to illustrative embodiments of the present disclosure;

FIG. 5E is a cross section and FIG. 5F is a corresponding cut-away plan view of the print layers of FIGS. 5A-5D micro-assembled with an alignment structure on a component substrate and with patterned electrodes according to illustrative embodiments of the present disclosure;

FIG. 9A is a cross section and FIG. 9B is a plan view of a printable vertical capacitor print layer according to illustrative embodiments of the present disclosure;

FIG. 9C is a cut-away plan view of a micro-assembled stacked capacitor with vertical-capacitor print layers corresponding to FIGS. 9A and 9B and patterned electrodes micro-assembled on a component substrate according to illustrative embodiments of the present disclosure;

FIGS. 11A-11D are plan views and cross sections of different-area print layers of a micro-assembled resistor according to illustrative embodiments of the present disclosure;

FIGS. 12A-12D are plan views and cross sections of different-area print layers of a micro-assembled inductor or a micro-assembled antenna according to illustrative embodiments of the present disclosure;

FIGS. 13-14 are cross sections of stacked electronic components comprising adhesive layers according to illustrative embodiments of the present disclosure;

FIG. 15 is a cross section of a stacked electronic component on a target substrate according to illustrative embodiments of the present disclosure;

FIG. 22 is a plan view and cross section of a print layer having an epitaxial or semiconductor layer and active circuit according to illustrative embodiments of the present disclosure; and FIG. 23 is a cross section of a stacked electronic component disposed on and electrically connected to an active circuit in or on a target or component substrate according to illustrative embodiments of the present disclosure.

Figure 1A:
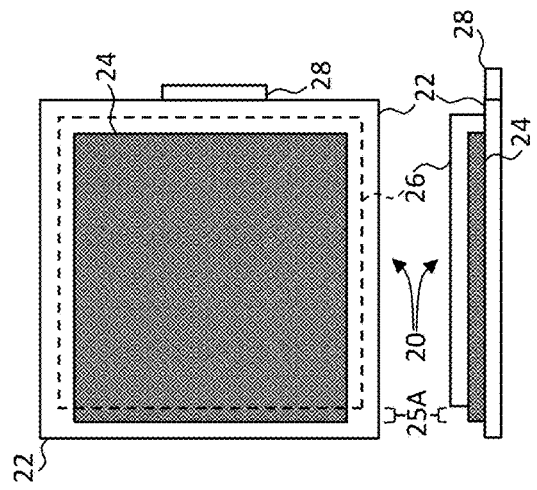
FIGS. 1A-1D are plan views and cross sections of different-area print layers of a micro-assembled electronic component according to illustrative embodiments of the present disclosure.
Figure 1B:
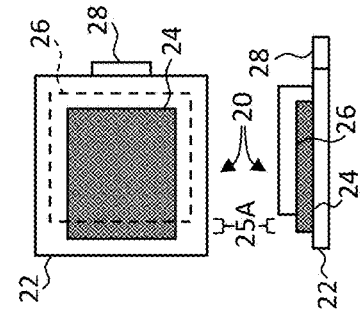
Figure 1C:
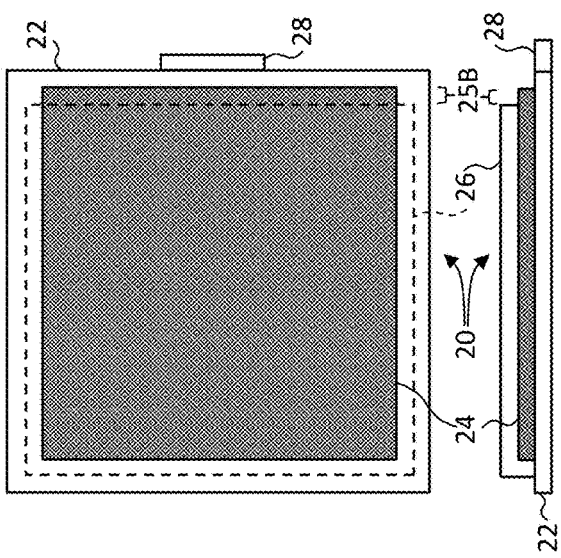

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The Figures are not drawn to scale since the variation in size of various elements in the Figures is too great to permit depiction to scale.

DETAILED DESCRIPTION OF CERTAIN EMBODIMENTS

The present disclosure provides, inter alia, structures and methods for stacked electronic components. The stacked electronic components can be active electronic components or passive electronic components. The stacked electronic components comprise three or more print layers disposed in a stack over a substrate, such as a component or a target substrate. The print layers are mutually non-native to each other, e.g., and any destination or target substrate but at least some print layers can be native to a common source wafer. Reference herein to "print layers" refers to, in some embodiments, three or more print layers. Each print layer comprises a dielectric layer (e.g., substrate) comprising dielectric material and a functional layer comprising electrically functional material. Each print layer in the stack has a successively smaller area than the previous print layer in the stack. The functional materials in each print layer are electrically connected together with a patterned coating of electrically conductive material, such as a metal, to form electrodes electrically connecting the functional layers to external devices. The functional materials in some print layers can be electrically connected together with functional-layer connections internal to the stack. The functional materials in the print layers can comprise, without limitation, passive electronic materials such as electrical conductors (e.g., planar, serpentine, or three dimensionally structured conductors, for example surrounded by dielectric that forms a planarizing layer) or active materials comprising epitaxial layers or semiconductor substrates comprising active circuits with transistors or diodes. The stacked electronic components can be passive electronic devices such as capacitors, resistors, inductors, and antennas or active electronic devices such as multi-layer integrated circuits.

The stacked electronic components can be micro-assembled massively in parallel using transfer printing (e.g., micro-transfer printing) with excellent efficiency and at reduced cost in a simple, efficient, extensible, flexible, and cost-effective way. The stacked electronic components can be constructed in common processing steps with integrated circuits, can be very small, and can be integrated directly into or on integrated circuit dies or in unpackaged circuits on a micro-substrate such as a component substrate. Stacked passive electronic components of the present disclosure can provide, in a small, dense structure, functional parameters (e.g., capacitance, resistance, inductance) much greater than conventional thin-film planar structures found in integrated circuits.

Figure 1D:
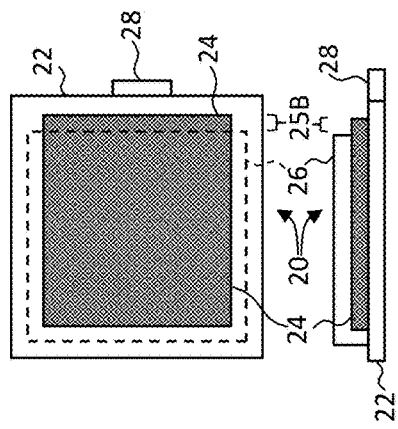
Figure 1E:
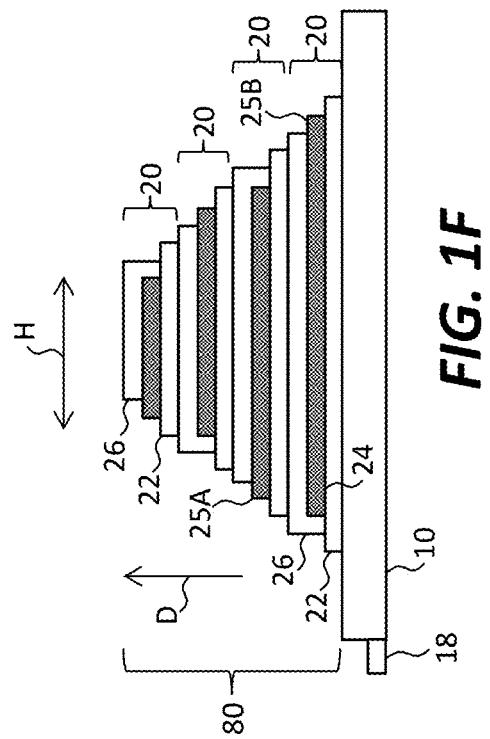
FIG. 1E is a plan view and FIG. 1F is a corresponding cross section of the print layers of FIGS. 1A-1D micro-assembled on a component substrate according to illustrative embodiments of the present disclosure.
Figure 1F:
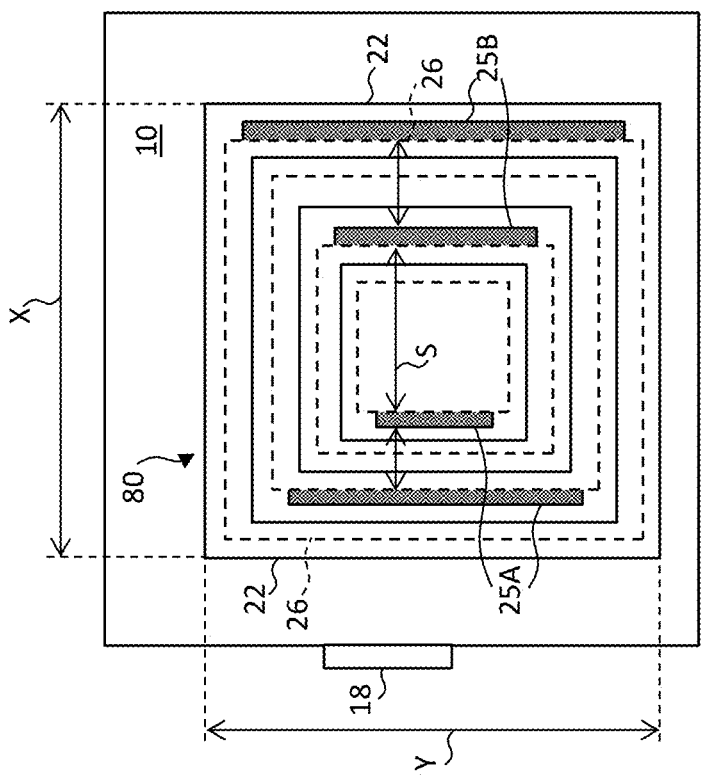

According to some embodiments of the present disclosure and with reference to FIGS. 1A-1I, a stacked electronic component 90 (e.g., a micro-assembled integrated circuit, a micro-assembled antenna 96, a micro-assembled capacitor 97, a micro-assembled resistor 98, a micro-assembled inductor 99) comprises a stack 80 of print layers 20. As shown in FIGS. 1A-1D, each print layer 20 in stack 80 has an area less than any other print layers 20 beneath print layer 20 in stack 80, so that stack 80 can have a pyramidal appearance with successively smaller layers toward the top of the pyramid, as shown in FIG. 1F. Stack 80 can extend in a vertical direction away from an underlying substrate, such as a component substrate 10, so that an area of a print layer 20 is over a horizontal surface of component substrate 10 orthogonal to vertical direction D of stack 80.

Each print layer 20 comprises a dielectric layer 22 and a functional layer 24 disposed on dielectric layer 22. Dielectric layer 22 can be a dielectric substrate on which functional layer 24 is disposed (e.g., by micro-transfer printing so that functional layer 24 is non-native to dielectric layer 22) or on which functional layer 24 is formed, so that functional layer 24 is native to dielectric layer 22. Functional layer 24 can be a passive electrical conductor patterned to provide a specific function or an epitaxial layer or semiconductor substrate that can be processed to form an electronic circuit comprising active electronic devices, e.g., as found in integrated circuits.

Functional layer 24 comprises an exposed conductive portion 25 (e.g., exposed conductive portions 25A and 25B, collectively exposed conductive portions 25) that is not covered with a dielectric layer 22 of any of print layers 20. Each exposed conductive portion 25 can be a passive electrical conductor such as a contact pad electrically connected to functional layer 24 and is spatially separated (e.g., by a spatial separation S) from any other exposed conductive portion 25 in a direction orthogonal to stack 80 (e.g., a horizontal direction H), as shown in FIG. 1E. Stack 80 can be disposed on a component substrate 10 and extend from component substrate 10 in a vertical direction D, e.g., a vertical direction D orthogonal to horizontal directions H of a surface of component substrate 10. Thus, a print layer 20 beneath another print layer 20 is vertically between the other print layer 20 and component substrate 10. Likewise, a print layer 20 vertically above another print layer 20 is on or over a side (surface) of the other print layer 20 opposite component substrate 10. Moreover, print layers 20 can be substantially planar (e.g., having a length and width in horizontal direction H much greater than a thickness in a vertical direction D) and extend in horizontal direction H orthogonal to vertical stack direction D. Spatial separation S can be in a horizontal direction H orthogonal to stack direction D. In some embodiments, spatial separation S is zero, that is two exposed conductive portions 25 can abut each other, but cannot overlap (e.g., are nonoverlapping) so that a vertical line extending from component substrate 10 in direction D cannot pass through two exposed conductive portions 25.

As shown in FIG. 1G, an electrode layer 30 is coated on at least a portion of stack 80 and then patterned to define one or more electrodes 32 (e.g., electrodes 32A, 32B, collectively electrodes 32), as shown in FIGS. 1H and 1I. Each electrode 32 is in electrical contact with an exclusive subset of exposed conductive portions 25. Multiple electrical connections to a common exposed conductive portion 25 of a print layer 20 are a common electrode 32. Coating and patterning electrodes 32 over stack 80 and in electrical contact with exposed conductive portions 25 provides a simple, efficiently constructed, and highly conductive connection to the multiple print layers 20 in stack 80. In some embodiments, electrodes 32 are coated over print layer 20 surfaces (e.g., at least partially on dielectric layer 22, including a vertical edge of dielectric layer 22, and at least partially on exposed conductive portions 25) and, optionally, at least partially on a top dielectric layer 26 disposed on or over at least a portion of functional layer 24. In some embodiments, electrodes 32 and, more generally, stacked electronic components 90 do not comprise bond wires, which are fragile and prone to failure unless packaged (which greatly increases the component size).

FIGS. 1A, 1B, 1C, and 1D illustrate four print layers 20 with successively smaller areas in plan view and cross section. In some embodiments, each print layer 20 comprises a dielectric layer 22 (for example an oxide or nitride layer such as silicon dioxide or silicon nitride or, in some embodiments, an organic resin, such as a cured polymer, e.g., epoxy or photoresist) and a functional layer 24 (for example a low-resistance electrical conductor such as a metal such as aluminum, copper, silver, or gold, a resistive electrical conductor such as polysilicon, or an epitaxial layer deposited by evaporation, chemical vapor deposition, or sputtering or a semiconductor substrate disposed by transfer printing, (e.g., micro-transfer printing) disposed and patterned on dielectric layer 22, for example using photolithographic methods and materials. Print layers 20 are disposed on a substrate, for example component substrate 10, in an ordered stack 80 so that each print layer 20 in stack 80 has an area smaller than all other print layers 20 beneath print layer 20 (e.g., closer to component substrate 10). An area of a print layer 20 can be the area of print layer 20 over component substrate 10 (e.g., a footprint of print layer 20) equal to the product of an X dimension and a Y dimension of print layer 20 (shown in FIG. 1E for print layer 20 of FIG. 1A). A direction D of stack 80 (shown in FIG. 1F) is a vertical upward (up) direction away from component substrate 10 in the direction of decreasing areas of print layers 20 in stack 80. A top print layer 20 is the print layer 20 farthest from component substrate 10 and a bottom print layer 20 is the print layer 20 closest to component substrate 10. A downward (down) direction is a vertical direction opposite D and in the direction of print layers 20 with increasing areas from top print layer 20 to bottom print layer 20. Those knowledgeable in the art will understand that up and down, top and bottom, over and under, and above and beneath are relative references and can be exchanged, for example by turning stacked electronic component 90 over. Adjacent print layers 20 are print layers 20 for which no other print layer 20 is between the adjacent print layers 20 in direction D or opposite direction D. Bottom print layer 20 is adjacent to component substrate 10.

In embodiments according to FIGS. 1A-1I, an additional dielectric layer (top dielectric layer 26, for example comprising patterned oxides or nitrides such as silicon dioxide or silicon nitride or organic materials such as adhesive or epoxies) is disposed over functional layer 24 in each print layer 20. In such embodiments, dielectric layer 22 can be a bottom dielectric layer 22. Top dielectric layer 26 can have a top area (footprint) over component substrate 10 and bottom dielectric layer 22 can have a bottom area (footprint) over component substrate 10. In each print layer 20, the bottom area can be greater than an area of functional layer 24 and the area of functional layer 24 can be greater than the top area so that functional layer 24 extends beyond top dielectric layer 26 over bottom dielectric layer 22 to form exposed conductive portions 25A, 25B. Top dielectric layer 26 can cover all of functional layer 24 except exposed conductive portions 25. According to some embodiments, each functional layer 24 is exclusively directly adjacent to a dielectric layer 22 in different print layers 20 or in the same print layer 20 (e.g., between bottom dielectric layer 22 and top dielectric layer 26). Exposed conductive portions 25A can be electrically connected to a common electrode 32A and exposed conductive portions 25B can be electrically connected to a common electrode 32B. However, embodiments of the present disclosure are not limited to two electrodes 30 and two exclusive subsets of exposed conductive portions 25. In some embodiments, three or more of each are provided. Top and bottom dielectric layers 26, 22 and functional layers 24 can be constructed using photolithographic methods and materials, for example deposition by sputtering or evaporation and patterning by photoresist deposition, masking, and etching. In embodiments in which functional layer 24 is a semiconductor substrate, e.g., is an unpackaged micro-chip, the semiconductor substrate can be disposed on dielectric layer 22 by micro-transfer printing and can comprise a broken (e.g., fractured) or separated tether (not shown in the Figures).

As shown in FIGS. 1E and 1F, print layers 20 are successively disposed on component substrate 10, for example using transfer printing, such as micro-transfer printing, in order of area size, with the largest-area print layer 20 disposed first (e.g., print layer 20 as shown in FIG. 1A) and the smallest-area print layer 20 disposed last (e.g., print layer 20 as shown in FIG. 1D) to form stack 80 of print layers 20. Each successive print layer 20 is disposed so that exposed conductive portion 25A or 25B on each print layer 20 remains exposed and extends beyond dielectric layers 22 of print layers 20 above it in stack 80.

For clarity, the plan view Figures of the present disclosure illustrate electrodes 32 (e.g., electrodes 32A and 32B) with transparent rectangles outlined with solid lines and top dielectric layers 26 with transparent rectangles outlined with dashed lines. Bottom dielectric layers 22 are illustrated with white rectangles outlined with solid lines and functional layers 24 are illustrated with filled rectangles outlined with solid lines. Exposed conductive portions 25 are electrically conductive portions of functional layers 24, such as a contact pad. In some embodiments, print layers 20 are transfer printable print layers 20 with print-layer tethers 28. For clarity of illustration, print-layer tethers 28 are not shown in the plan views and cross sections of print layer 20 stacks 80 (e.g., FIGS. 1E, 1I and FIGS. 1F-1H, respectively) but can be shown in the plan views of individual print layers 20 (e.g., FIGS. 1A-1D).

Figure 19:
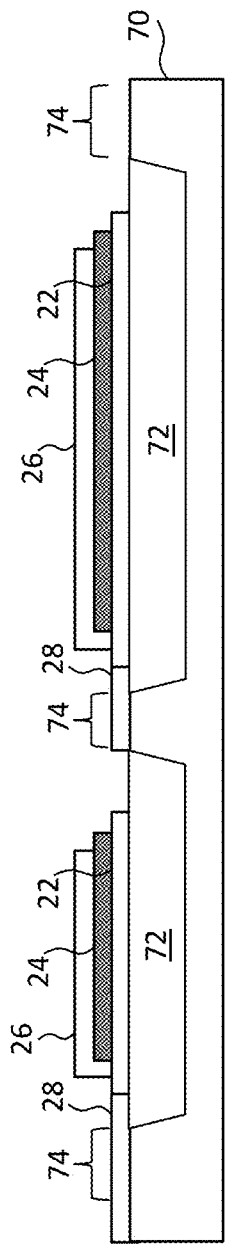
FIG. 19 is a cross section of different-area transfer-printable printed layers in a print-layer source wafer according to illustrative embodiments of the present disclosure.

Print layers 20 can be micro-transfer printed from a print-layer source wafer 70 (e.g., as shown in FIG. 19) comprising sacrificial portions 72 spatially and laterally separated by anchors 74 with a print layer 20 disposed completely, directly, and exclusively over each sacrificial portion 72 with a print-layer tether 28 physically connecting each print layer 20 to an anchor 74. After sacrificial portion 72 is etched to form a gap between print layer 20 and print-layer source wafer 70, a stamp, e.g., a visco-elastic stamp with stamp posts, contacts each print layer 20 to adhere print layer 20 to the stamp post, removes print layers 20 from print-layer source wafer 70 thereby fracturing print-layer tethers 28, and disposes print layer 20 on stack 80 or component substrate 10.

Once print layers 20 are disposed in stack 80, for example on or over component substrate 10, electrode layer 30 can be disposed (e.g., coated by evaporation, sputtering, or spray coating), for example in an unpatterned blanket coating as shown in FIG. 1G and then patterned using photolithographic methods and materials. Electrode layer 30 can comprise any suitable electrical conductor, for example a metal such as aluminum, silver, gold, titanium, tungsten, copper, a metal alloy, a conductive oxide such as indium tin oxide, or a conductive polymer such as polythiophene. Electrode layer 30 can be, but is not necessarily, transparent or reflective. After deposition, electrode layer 30 is patterned, for example using photolithography, to form electrodes 32 (e.g., electrodes 32A, 32B) as shown in FIGS. 1H and 1I, to complete micro-assembled and stacked electronic component 90. Thus, all of electrodes 32 are disposed, formed, and patterned in a common layer with common processing steps, reducing costs and improving manufacturing throughput.

Electrodes 32 can be any coated and patterned electrical conductor, for example electrically conductive metal layers, can be metal oxide conductors, can be organic conductors such as polythiophene, can be transparent or opaque, and can be provided in various widths, materials, and thicknesses. In general, stacked electronic components 90 can have any number of electrodes 32. For applications such as a micro-assembled antenna 96, stacked electronic components 90 can have one or two electrodes 32. For applications such as a micro-assembled capacitor 97, micro-assembled resistor 98, or micro-assembled inductor 99, stacked electronic components 90 can have two electrodes 32, for example only two electrodes 32. For applications forming an active electronic circuit (e.g., a stacked integrated circuit), stacked electronic components 90 can have more than two electrodes 32, for example three to ten electrodes 32, and can include power, ground, and signal electrodes 32. FIGS. 1H (in cross section) and 1I (in plan view) illustrate a stack 80 of print layers 20 with bottom dielectric layers 22, functional layers 24, patterned top dielectric layers 26, and exposed conductive portions 25 (e.g., exposed conductive portions 25A and 25B) electrically connected with electrodes 32 (e.g., electrodes 32A, 32B) disposed on component substrate 10 with component tether 18.

Figure 20:
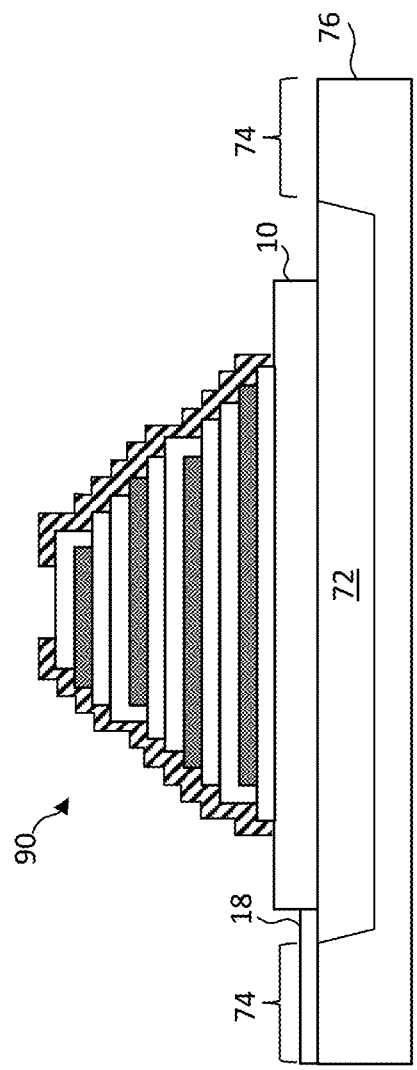
FIG. 20 is a cross section of a transfer-printable stacked electronic component disposed on a component substrate in a component source wafer according to illustrative embodiments of the present disclosure.

Coated electrodes 32A, 32B can be made in parallel using photolithography for a great number of stacked electronic components 90 on a component source wafer 76 (e.g., as shown in FIG. 20) at the same time and are therefore made more efficiently than other interconnection methods such as bond wires, which are sequentially connected by a bond wire machine. Coated electrodes 32A, 32B can also have a greater conductivity and emit less electromagnetic radiation in operation than bond wires, since they can be thicker, curve less, and do not extend away from print layers 20 or component substrate 10 (e.g., into the air). Coated electrodes 32A, 32B can also have smaller dimensions than bond wires, for example having a width or thickness no greater than 25 microns, no greater than 20 microns, no greater than 15 microns, no greater than 10 microns, no greater than 5 microns, or no greater than 2 microns. In some embodiments, exposed conductive portions 25A, 25B of print layers 20 are electrically connected exclusively by patterned electrode layer 30 (e.g., by electrodes 32A, 32B) and are not electrically connected by bond wires. In some embodiments, exposed conductive portions 25 of print layers 20 can have an exposed length or width in a horizontal direction H that is less than 25 microns, less than 20 microns, less than 15 microns, less than 12 microns, or less than 10 microns. Such small exposed conductive portions 25 can be too small to electrically connect with bond wires but are readily electrically connected with electrodes 32. Moreover, embodiments of the present disclosure enable electrical connections between different print layers 20 in stack 80 without the use of expensive and complex through-silicon vias or through-substrate vias (e.g., vias through dielectric layer 22), reducing costs and enhancing manufacturability of stacked electronic components 90 of the present disclosure.

As shown in FIG. 20, stacked electronic component 90 can be constructed on a component substrate 10 of a component source wafer 76 with sacrificial portions 72 laterally separated by anchors 74 and a stacked electronic component 90 disposed exclusively, directly, and completely over each sacrificial portion 72, connected to anchor 74 with component tether 18, and transfer printed to a target substrate 50 (shown in FIG. 15 discussed below) using a stamp to adhere stacked electronic component 90 to the stamp, removing the stamp with stacked electronic component 90 and fracturing component tether 18, and printing stacked electronic component 90 to target substrate 50. Once stacked electronic component 90 is disposed on its final substrate (e.g., formed in place on component substrate 10, formed in place on target substrate 50, or transfer printed from component source wafer 76 to target substrate 50), it can be electrically interconnected to any electronic circuit or wires on final target substrate 50, for example with metal wires constructed using photolithographic methods and materials. In some embodiments, the electrical connection of stacked electronic component 90 to any external circuits or electrical connections is done in a common step with disposing electrode layer 30 and patterning electrodes 32A, 32B, reducing photolithographic processing steps and costs for the final electronic system.

Component substrate 10 or a final target substrate 50 can be a glass or polymer substrate or, in some embodiments, an unpackaged semiconductor die, for example a portion of an integrated circuit and for example part of a semiconductor wafer having a surface on which print layers 20 can be disposed, e.g., transfer printed. In some embodiments, component substrate 10 or a final target substrate 50 is a module substrate on which an unpackaged integrated circuit or semiconductor die is disposed. Such integrated circuits can be, but are not limited to, silicon circuits, such as CMOS, or compound semiconductor circuits formed in doped or undoped compound semiconductors such as GaN, GaAs, InP and comprising light-emitting diodes, high-power or high-electronic mobility transistors, micro-electromechanical device, and sensors. Component substrate 10 or final target substrate 50 can be, but is not limited to, glass, plastic, semiconductor, compound semiconductor, or ceramic. Generally, component substrate 10 or target substrate 50 can be any substrate on which print layers 20 and electrode layer 30 can be disposed, for example a semiconductor substrate or a glass or plastic substrate as found in the display or integrated circuit industries. Component substrate 10 can be rigid or flexible as well as transparent or opaque.

In the FIGS. 1A-1I illustrations, stacked electronic component 90 and print layers 20 are substantially rectangular (excluding any print-layer tethers 28 or component tethers 18) and exposed conductive portions 25 are disposed on opposing sides (opposing edges) of the rectangle. More generally, stacked electronic component 90 and print layers 20 can have any shape in horizontal direction H over component substrate 10 or target substrate 50, for example polygonal shapes. Exposed conductive portions 25 can be disposed on opposing sides (opposing edges) of a perimeter of the polygon. As shown in the embodiments of FIGS. 2A-2E, stacked electronic component 90 and print layers 20 are substantially rectangular and exposed conductive portions 25 are each disposed on three sides of the rectangle, extending completely over opposing sides and less than halfway on the other sides to enable exclusive electrical connection to different electrodes 32. (As used herein, when referring to a vertical direction D, a side of print layer 24 is a surface of print layer 24, when referring to a shape of print layer 24 or horizontal direction H, a side of print layer 24 is an edge or portion of a perimeter of print layer 24 in a horizontal plane.)

Figure 2A:
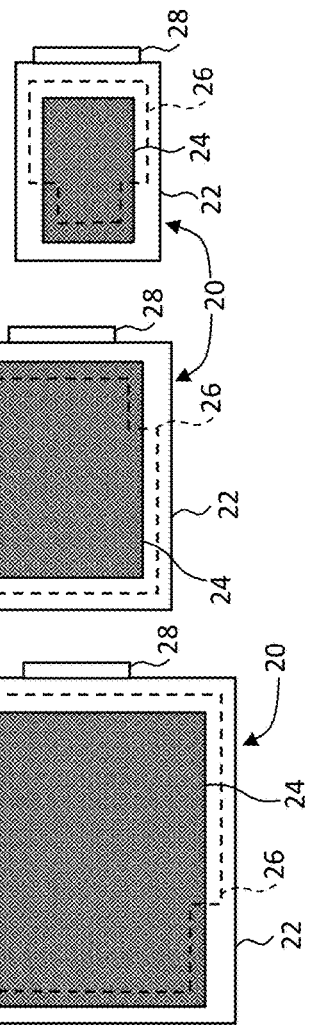
FIGS. 2A-2D are plan views and cross sections of different-area print layers of a micro-assembled electronic component according to illustrative embodiments of the present disclosure.
Figure 2B:
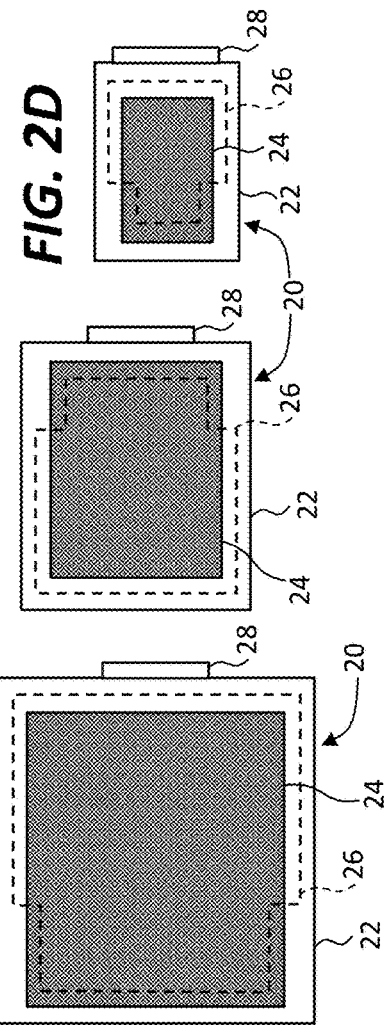
Figure 2C:
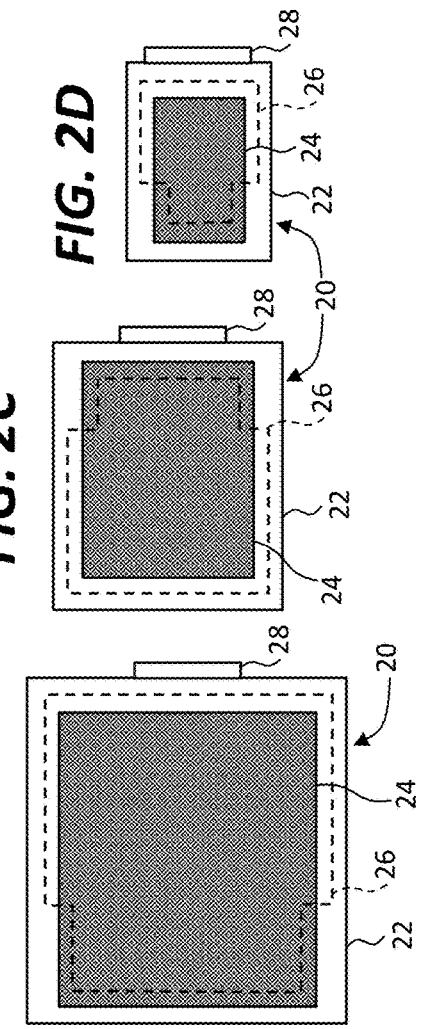
Figure 2D:
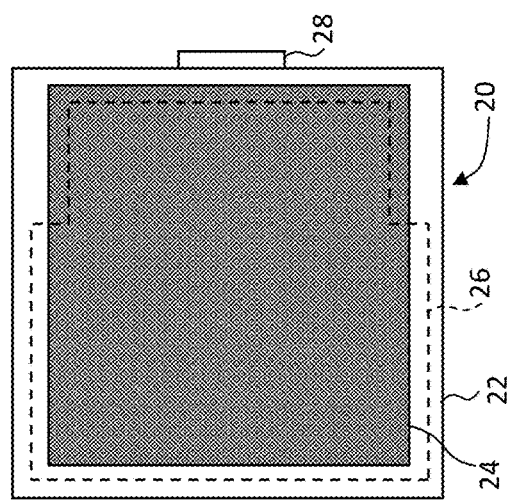
Figure 2E:
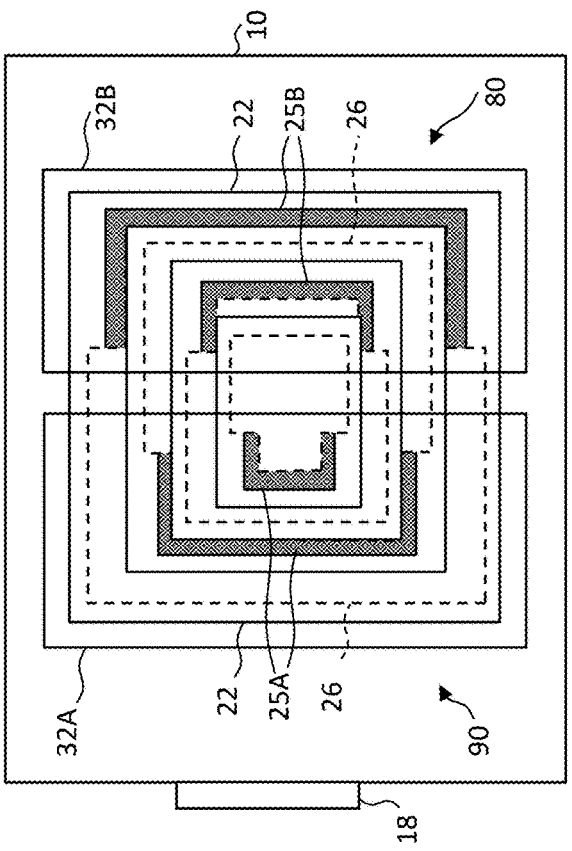
FIG. 2E is a cut-away plan view of the print layers of FIGS. 2A-2D micro-assembled on a component substrate with patterned electrodes according to illustrative embodiments of the present disclosure.

The different shapes of exposed conductive portions 25 can be defined by appropriately patterning top dielectric layer 26 or by patterning functional layer 24. FIGS. 2A-2D illustrate print layers 20 similar to those of FIGS. 1A-1D except with a differently patterned top dielectric layer 26 disposed over functional layer 24 on bottom dielectric layer 22. FIG. 2E illustrates a stack 80 of print layers 20 with bottom dielectric layers 22, functional layers 24, patterned top dielectric layers 26, and exposed conductive portions 25 (e.g., 25A and 25B) electrically connected with electrodes 32 (e.g., electrodes 32A, 32B) disposed on component substrate 10 with component tether 18. In some embodiments and as illustrated in FIGS. 4A-4F discussed further below, exposed conductive portions 25 can all be disposed on a common side (common edge) of stacked electronic component 90 and a common side of all of print layers 20. As with the embodiments of FIGS. 2A-2E, this can be achieved by appropriately patterning top dielectric layer 26.

By appropriately patterning top dielectric layer 26 to expose desired portions of functional layer 24 (e.g., exposed conductive portions 25), exposed conductive portions 25 (e.g., exposed conductive portions 25A, 25B) can be spatially located over component substrate 10 and in stacked electronic component 90 to enable a simple pattern at low resolution for electrodes 32 electrically connecting exposed conductive portions 25A and 25B corresponding to electrodes 32A and electrode 32B, respectively. Moreover, larger or more extensive exposed conductive portions 25 can increase an electrical connection area to functional layer 24. Such simple electrode 32 shapes (e.g., rectangles) improve current flow, reduce electromagnetic radiation, and reduce resolution requirements for the masks needed to pattern electrodes 32. Such spatial locations can be achieved by disposing none of exposed conductive portions 25 electrically connected to a first electrode 32 spatially between exposed conductive portions 25 electrically connected to a different second electrode 32 in horizontal direction H (e.g., a direction orthogonal to stack direction D and parallel to a surface of component substrate 10). For example, and as shown in FIGS. 1H and 1I and in FIG. 2E, exposed conductive portions 25A are electrically connected to electrode 32A and exposed conductive portions 25B are electrically connected to electrode 32B. None of exposed conductive portions 25A are spatially located in horizontal direction H between any of exposed conductive portions 25B. Likewise, none of exposed conductive portions 25B are spatially located in a horizontal direction between any of exposed conductive portions 25A.

In embodiments in which electrodes 32 have more complex shapes, exposed conductive portions 25A electrically connected by electrodes 32A can be disposed spatially in horizontal direction H between exposed conductive portions 25B electrically connected by electrodes 32B.

Figure 3G:
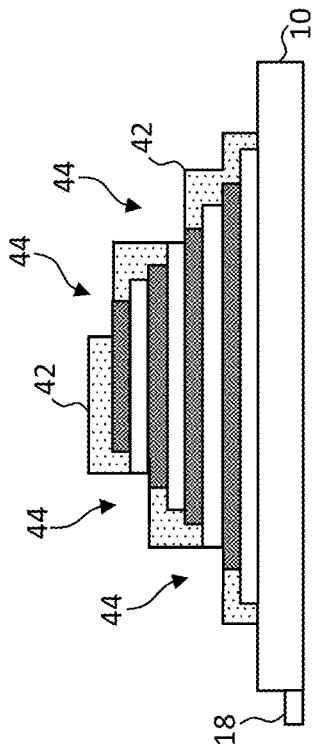
FIG. 3G is a cross section of the structure of FIGS. 3E and 3F coated with a dielectric according to illustrative embodiments of the present disclosure.
Figure 3H:
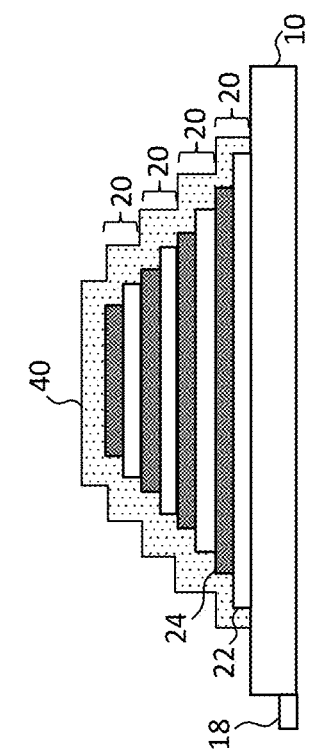
FIG. 3H is a cross section of the structure of FIG. 3G with the dielectric patterned to form vias according to illustrative embodiments of the present disclosure.
Figure 3I:
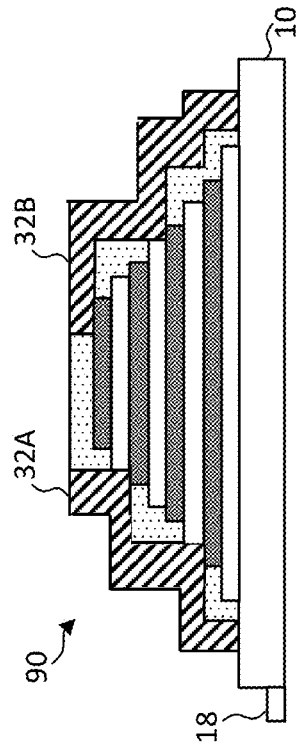
FIG. 3I is a cross section of the structure of FIG. 3H coated with an electrode layer according to illustrative embodiments of the present disclosure.
Figure 3J:
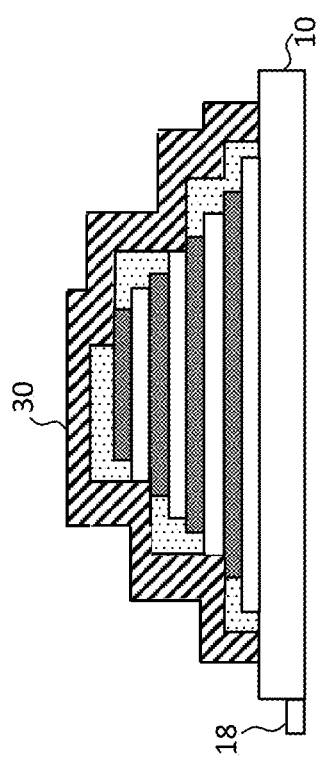
FIG. 3J is a cross section and FIG. 3K is a corresponding cut-away plan view of the structure of FIG. 3I with the electrode layer patterned to form electrodes according to illustrative embodiments of the present disclosure.
Figure 3K:
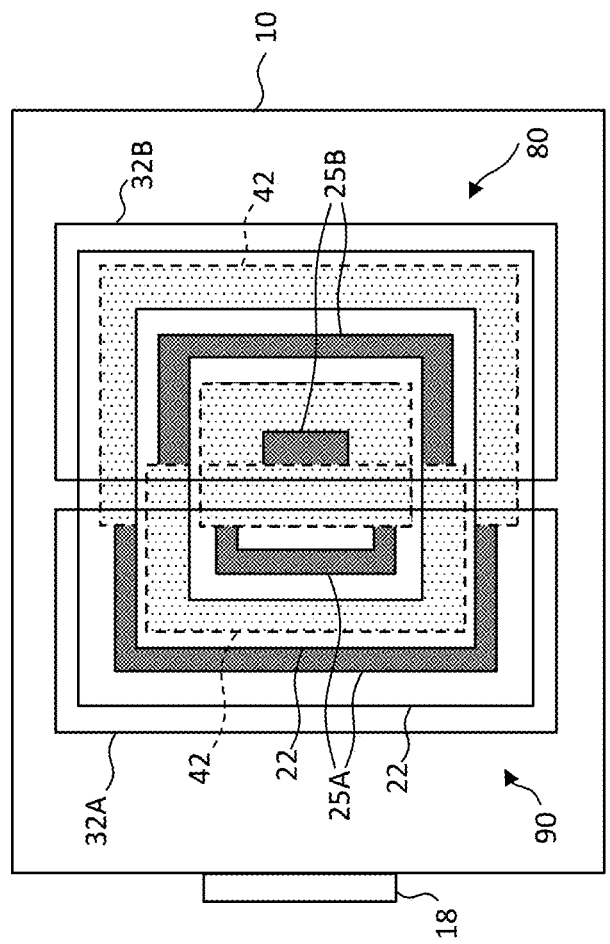

In embodiments according to FIGS. 1A-1I and 2A-2E, a top dielectric layer 26 is disposed over functional layer 24 in each print layer 20. Top dielectric layer 26 provides environmental protection to functional layer 24 but require an extra deposition and patterning step. In some embodiments, print layers 20 do not comprise a top dielectric layer 26. As shown in the embodiments of FIGS. 3A-3D, different-area print layers 20 each comprise a dielectric layer 22 with a functional layer 24 patterned on dielectric layer 22. Different-area print layers 20 are disposed in stack 80 on component substrate 10, for example by micro-transfer printing, as shown in the FIG. 3E plan view and FIG. 3F cross section with exposed conductive portion 25 of functional layer 24 in each print layer 20 exposed around or adjacent to the perimeter of each print layer 20. An unpatterned insulating layer 40, such as an uncured resin, adhesive, or photoresist, can be coated over stack 80 of print layers 20, as shown in FIG. 3G, and then patterned (for example using photolithographic patterning methods and materials) to form a patterned insulating layer 42 with vias 44 exposing exposed conductive portion 25 of each print layer 20, as shown in FIG. 3H. An unpatterned electrode layer 30 is then disposed over patterned insulating layer 42, vias 44, and exposed conductive portions 25, as shown in FIG. 3I, and patterned (for example using photolithographic methods and materials) to form electrodes 32A and 32B, as shown in FIGS. 3J and 3K. Thus, some embodiments of the present disclosure comprise a stacked electronic component 90 comprising a patterned insulating layer 42 disposed over stack 80 of print layers 20, vias 44 formed in patterned insulating layer 42, and one or more electrodes 32 electrically connected to exposed conductive portions 25 through vias 44.

As shown in FIGS. 4A-4F and according to some embodiments of the present disclosure, exposed conductive portions 25 can be arranged without the use of a patterned insulating layer 42 as in FIGS. 3A-3K. FIGS. 4A-4D illustrate different-area print layers 20 comprising a dielectric layer 22 on each of which is patterned a functional layer 24. Functional layers 24 and exposed conductive portions 25 of successive print layers 20 in stack 80 are alternately offset on the surface of and with respect to dielectric layer 22. The different print layers 20 are transfer printed into a stack 80 and patterned with a conductor (e.g., a metal), as shown in FIGS. 4E and 4F, to form electrodes 32A and 32B in a stacked electronic device 90. Dielectric layer 22 in each print layer 20 in stack 80 covers functional layer 24 of a print layer 20 beneath it in stack 80 except for the desired exposed conductive portion 25. Functional layers 24 offset with respect to dielectric layers 22 in print layers 20 enable stacked electronic components 90 without top dielectric layers 26, reducing the number of deposition and patterning steps necessary to construct stacked electronic components 90.

Any manufacturing process has resolution and alignment limitations. Transfer printing processes with large stamps and many print layers 20 (e.g., ten to one hundred thousand print layers 20) can have a print accuracy of 1-2 microns on target substrate 50 and in small transfers in optimal conditions a print accuracy of less than one micron, for example several hundred nanometers. Since stack 80 can comprise many print layers 20 and allowance must be made for the accuracy of each print step in any practical manufacturing process, according to some embodiments of the present disclosure and as illustrated in FIGS. 5A-8, a stacked electronic component 90 can comprise or be aligned with an alignment structure 12, for example disposed on component substrate 10 or target substrate 50, that can assist in aligning print layers 20. As shown in FIGS. 5A-5D, different-area print layers 20 each comprise a functional layer 24 patterned on a bottom dielectric layer 22 with an exposed conductive portion 25 (e.g., exposed conductive portions 25A, 25B) extending beyond patterned top dielectric layer 26. As shown in the cross section of FIG. 5E and cut-away plan view of FIG. 5F, print layers 20 with successively smaller areas, each comprising bottom dielectric layers 22, functional layers 24 on bottom dielectric layers 22, and top dielectric layers 26 on functional layers 24, are disposed in a stack 80 adjacent to, aligned by, and/or in contact with alignment structure 12. Alignment structure 12 has a side adjacent to a corresponding side of print layers 20 so that print layers 20 are aligned in one dimension along a side of alignment structure 12. In some embodiments and as shown in FIG. 5F, print layers 20 aligned with alignment structure 12 have exposed conductive portions 25 (e.g., exposed conductive portions 25A, 25B) on a common side (or edge) of print layers 20 opposite alignment structure 12. Exposed conductive portions 25A electrically connected to electrode 32A are on one half of the common side (edge) of print layers 20 and exposed conductive portions 25B electrically connected to electrode 32B are on the other half of the common side (edge) of print layers 20. Such an arrangement enables a simple structure (e.g., a rectangular structure) for electrodes 32.

Figure 7:
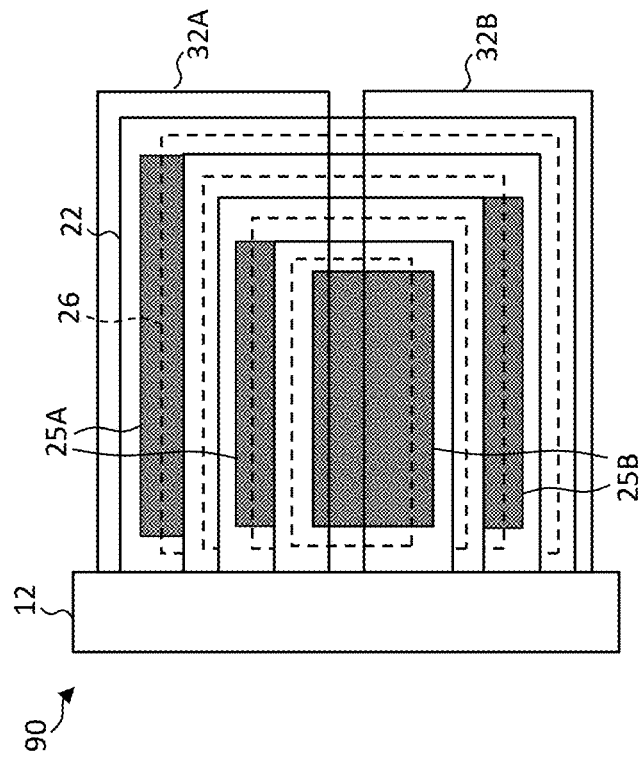
FIG. 7 is a cut-away plan view of a micro-assembled electronic component with patterned electrodes and a one-dimensional alignment structure micro-assembled on a component substrate according to illustrative embodiments of the present disclosure.
Figure 6:
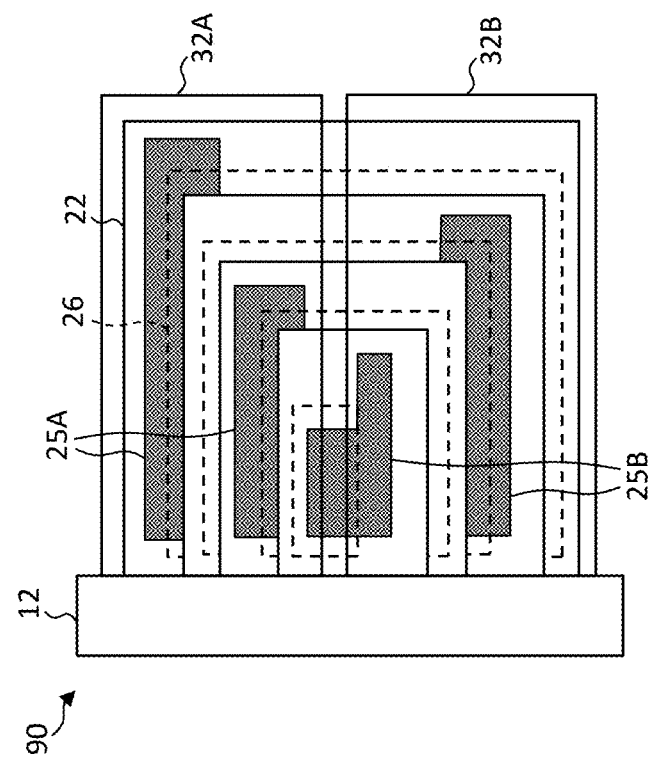
FIG. 6 is a cut-away plan view of a micro-assembled electronic component with patterned electrodes and an alignment structure micro-assembled on a component substrate according to illustrative embodiments of the present disclosure.
Figure 8:
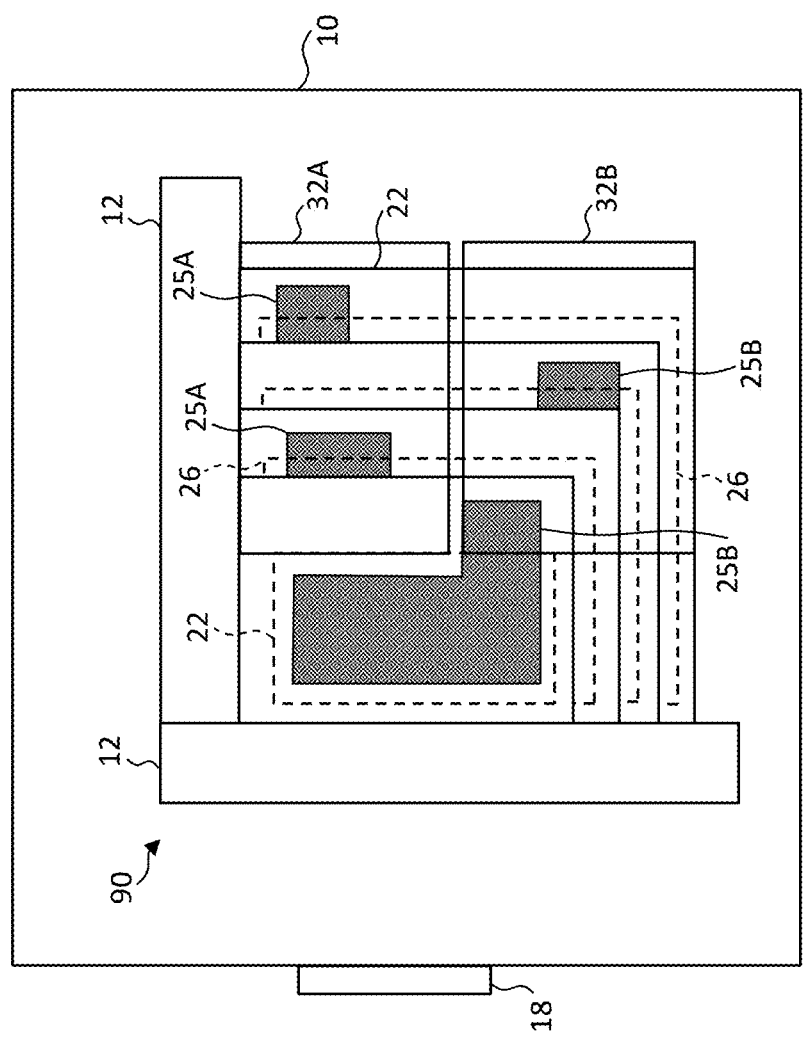
FIG. 8 is a cut-away plan view of a micro-assembled electronic component with patterned electrodes and a two-dimensional alignment structure micro-assembled on a component substrate according to illustrative embodiments of the present disclosure.

In some embodiments and as shown in FIG. 6, exposed conductive portions 25 can extend onto two sides (edges) of print layers 20. As shown in FIG. 7, exposed conductive portions 25A and 25B can be on opposing sides (edge) of print layers 20. FIG. 8 illustrates embodiments in which print layers 20 are aligned in two dimensions adjacent to, aligned by, and/or in contact with alignment structure 12 (or multiple orthogonal alignment structures 12) with exposed conductive portions 25 on a common side (edge) of print layers 20. Although alignment structures 12 are shown as solid and continuous along print layer 20 edges, in some embodiments alignment structures 12 extend only along a portion of print layer 20 edges.

According to some embodiments of the present disclosure, print layers 20 in stack 80 have successively smaller areas towards the top of stack 80 opposite component substrate 10 or target substrate 50. Print layers 20 can be arranged in a pyramid, so that edges on all sides of each print layer 20 are exposed, for example as shown in FIGS. 1A-4F. In some embodiments, common edges are aligned, for example one edge of each print layer 20 each respective edge in a common plane orthogonal to a surface of print layers 20, as shown in FIGS. 5E-7, or two edges of each print layer 20 each respective edge in a common plane orthogonal to a surface of print layers 20, as shown in FIG. 8. In some embodiments, not shown in the Figures, more than two edges of print layers 20 are aligned, for example three edges of rectangular print layers.

In general, according to some embodiments of the present disclosure, there is no particular limitation on the arrangements or locations of exposed conductive portions 25 of the different-area print layers 20, so long as an electrode 32 can electrically connect exposed conductive portions 25 of a subset of print layers 20, e.g., an exclusive subset of print layers 20. Electrodes 32 can have a variety of shapes including rectangles, curves, serpentine, and irregular configurations.

Embodiments of the present disclosure can enable a variety of stacked passive electronic components 90, including micro-assembled capacitors 97, micro-assembled resistors 98, micro-assembled inductors 99, and micro-assembled antennas 96 (discussed further below), and print layers 20 in each of these can have a variety of configurations. For example, as illustrated in FIG. 1A-8, functional layer 24 of each print layer 20 can be a conductive plate in a micro-assembled capacitor 97. As illustrated in FIGS. 9A-9C, print layers 20 can each be a vertical capacitor. A vertical capacitor can comprise one or more wells (e.g., holes, pits, or recesses) formed in dielectric layer 22, for example by etching with photolithographic methods and materials. A first functional layer 24A is disposed on dielectric layer 22 and in the wells. A patterned insulating layer 42 is disposed over first functional layer 24A, leaving conductive portion 25A exposed. A second functional layer 24B is disposed on patterned insulating layer 42 and in the wells and is optionally coated with top dielectric layer 26, leaving conductive portion 25B exposed. This vertical capacitor structure provides increased capacitance to print layer 20.

Figure 10A:
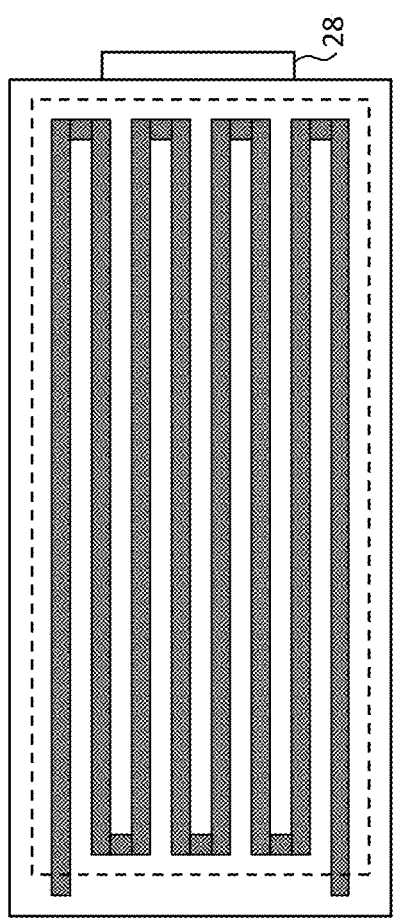
FIGS. 10A-10D are plan views and cross sections of different-area print layers of a resistor according to illustrative embodiments of the present disclosure.
Figure 10B:
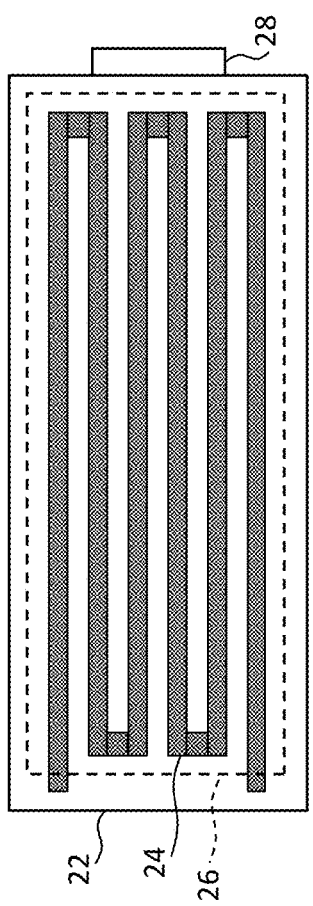
Figure 10C:
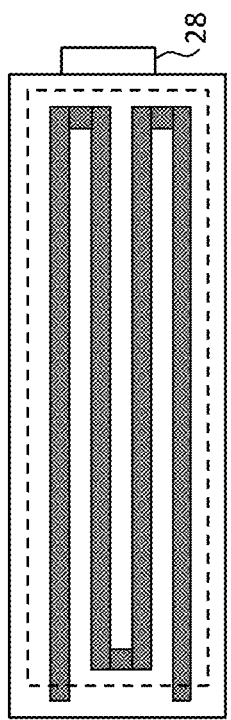
Figure 10D:
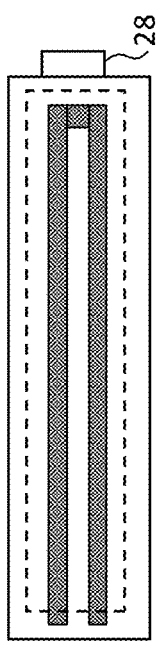
Figure 10E:
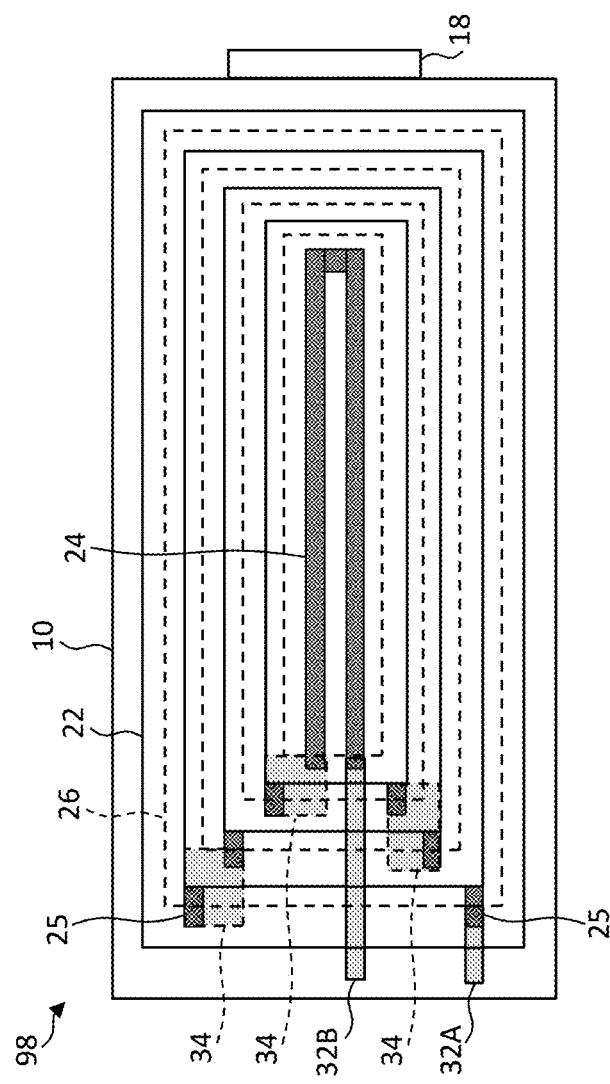
FIG. 10E is a cut-away plan view of a micro-assembled stacked resistor with layers corresponding to FIGS. 10A-10D and patterned electrodes micro-assembled on a component substrate according to illustrative embodiments of the present disclosure.
Figure 11E:
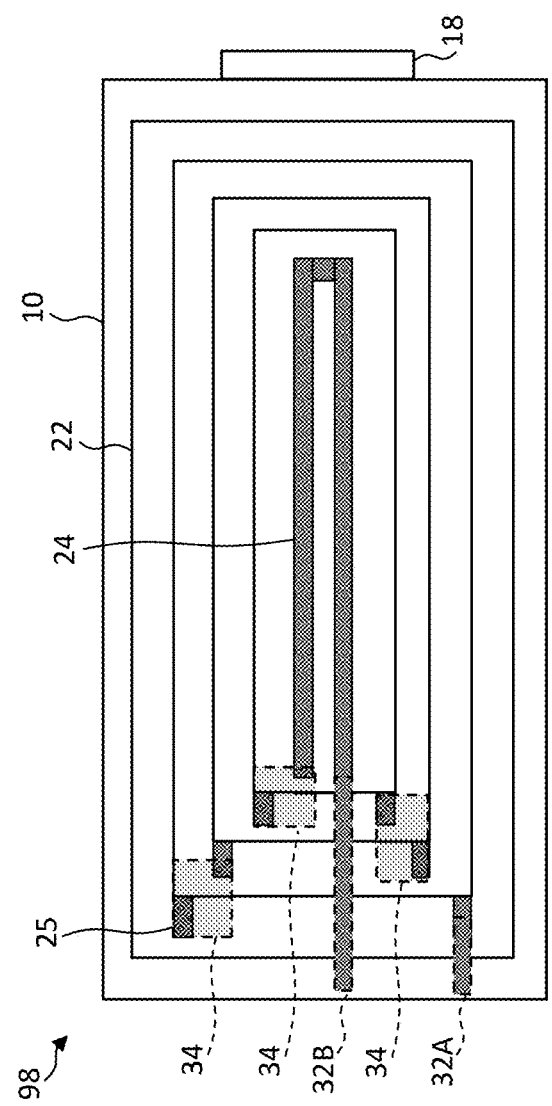
FIG. 11E is a cut-away plan view of a micro-assembled stacked resistor with print layers corresponding to FIGS. 11A-11D with patterned electrodes micro-assembled on a component substrate according to illustrative embodiments of the present disclosure.

FIGS. 1A-9C illustrate various configurations of a passive electronic micro-assembled capacitor 97 comprising stacks 80 of print layers 20. In these configurations, print layers 20 form two exclusive subsets with their exposed conductive portions 25 that include all of print layers 20. Each exclusive subset is electrically connected in parallel. According to some embodiments of the present disclosure and as illustrated in FIGS. 10A-11E, stacks 80 of print layers 20 form passive micro-assembled resistors 98. FIGS. 10A-10E illustrate micro-assembled resistor 98 embodiments comprising top dielectric layer 26 and FIGS. 11A-11E illustrate micro-assembled resistor 98 embodiments that do not comprise top dielectric layer 26 (e.g., corresponding to micro-assembled capacitors 97 of FIGS. 1A-1I and 3A-3K, respectively). As illustrated in FIGS. 10A-10D, print layers 20 each comprise bottom dielectric layer 22, functional layer 24 patterned on bottom dielectric layer 22, and top dielectric layer 26 patterned on functional layer 24, leaving exposed conductive portions 25. As illustrated in FIGS. 11A-11D, print layers 20 each comprise dielectric layer 22 and functional layer 24 patterned on dielectric layer 22 leaving exposed conductive portions 25. In both sets of embodiments, functional layer 24 forms an extended resistive electrical conductor, for example in a serpentine shape or other extended line and, for example, comprising polysilicon or a high-resistance metal or metal alloy. Exposed conductive portions 25A, 25B are at either end of the resistive electrical conductor in each print layer 20. As shown in FIGS. 10E and 11E, exposed conductive portion 25A of one print layer 20 is electrically connected to electrode 32A and exposed conductive portion 25B of one print layer 20 is electrically connected to electrode 32B. The remaining print layers 20 are electrically connected in series by patterned functional-layer connectors 34 to form a single, multi-layer micro-assembled resistor 98.

Figure 12D:
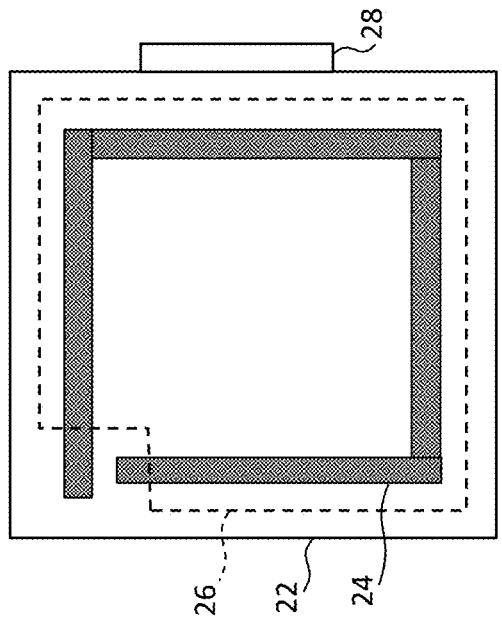
Figure 12C:
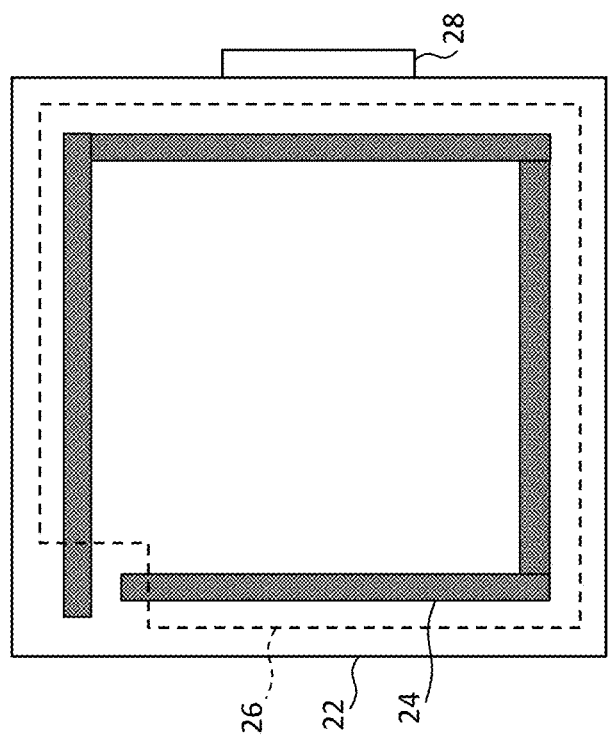
Figure 12E:
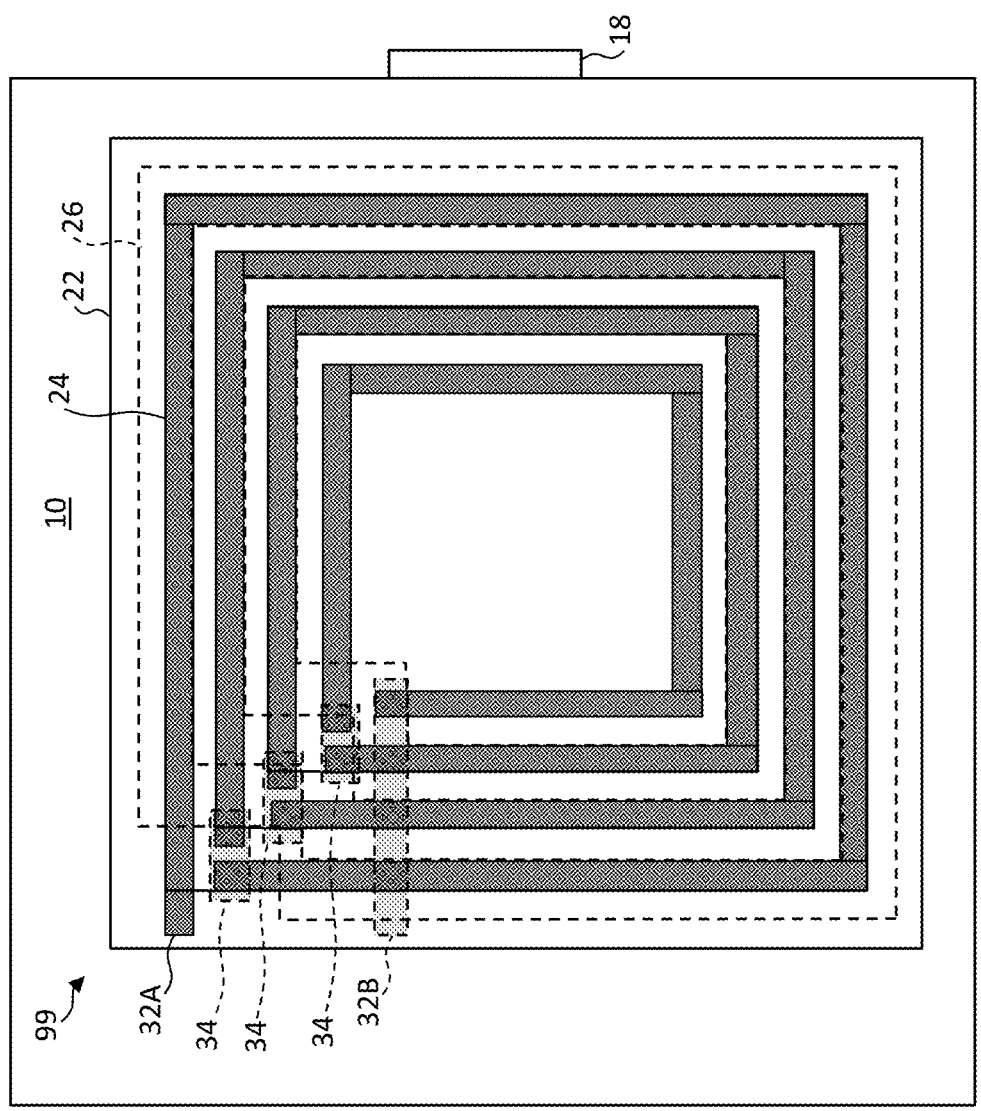
FIG. 12E is a cut-away plan view of a micro-assembled stacked inductor with print layers corresponding to FIGS. 12A-12D with patterned electrodes micro-assembled on a component substrate according to illustrative embodiments of the present disclosure.
Figure 12F:
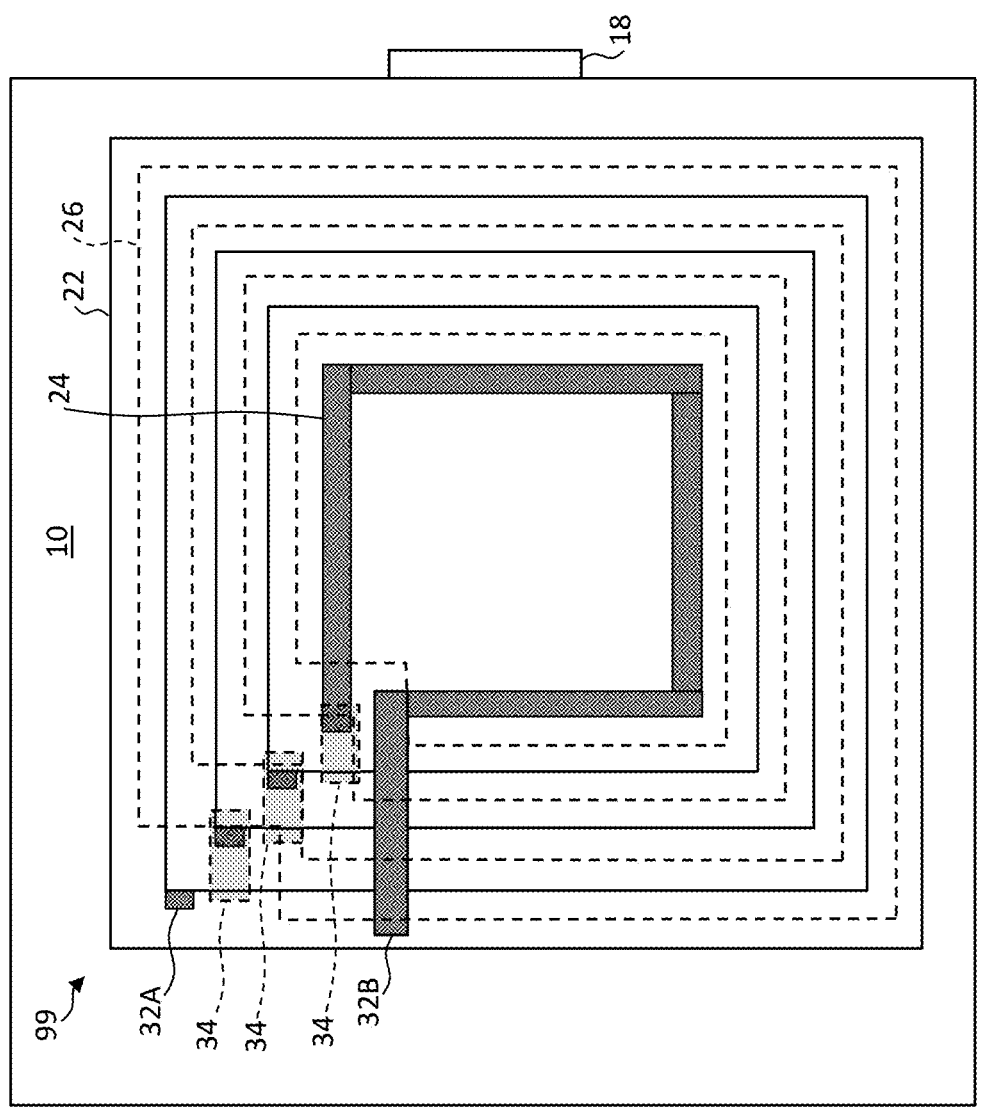
FIG. 12F is a plan view of a micro-assembled stacked inductor with layers corresponding to FIGS. 12A-12E with patterned electrodes micro-assembled on a component substrate according to illustrative embodiments of the present disclosure.

According to some embodiments of the present disclosure and as illustrated in FIGS. 12A-12F, a stacked electronic component 90 can be constructed as a micro-assembled inductor 99. As shown in FIGS. 12-12D, different-area print layers 20 each have a patterned functional layer 24 disposed on a bottom dielectric layer 22 and covered with an optional top dielectric layer 26. Functional layers 24 are each patterned to form a conductive line (wire) that extends substantially around and within the perimeter of dielectric layer 22, but the ends of the conductive line in a print layer 20 are not electrically connected. FIG. 12E illustrates a cut-away plan view showing the conductive lines of functional layers 24 and FIG. 12F is a plan view showing the structure with top dielectric layers 26 covering functional layers 24. As with micro-assembled resistor 98, functional-layer connectors 34 serially electrically connect exposed conductive portions 25 of adjacent print layers 20 so that the conductive lines form a spiral of increasing height (in this case with substantially rectangular sides corresponding to rectangular print layers 20). In some embodiments (not shown), each functional layer 24 in each print layer 20 can comprise a spiral that extends from an edge to a center and then, with additional metal layers passing over print layer 20 spiral to an edge where it is connected with functional-layer connector 34. A spiral formed in each print layer 20 can increase the inductance of micro-assembled inductor 99. Exposed conductive portions 25A, 25B at opposite ends of the spiral conductive lines electrically connected with functional-layer connectors 34 are electrically connected with electrodes 32A, 32B to complete micro-assembled inductor 99.

Figure 12G:
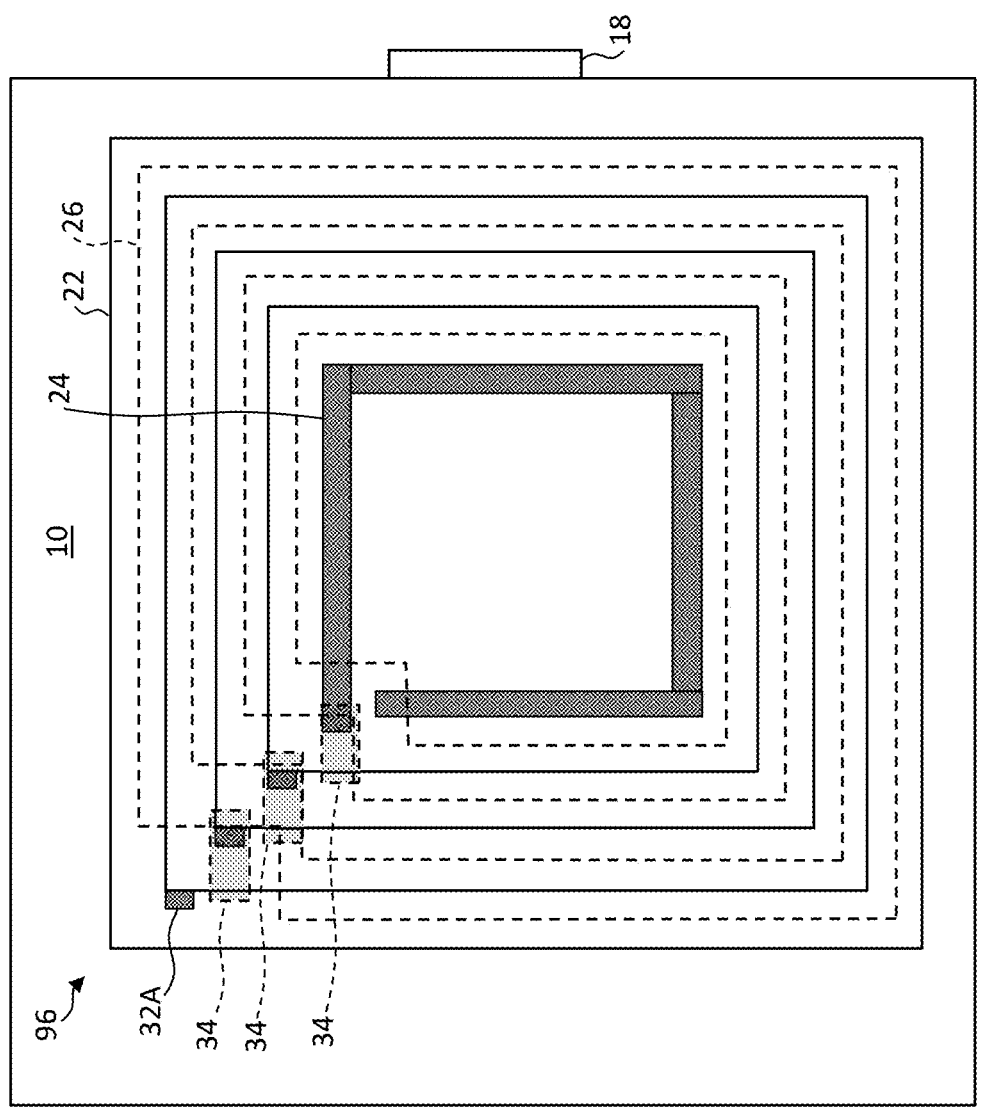
FIG. 12G is a plan view of a micro-assembled stacked antenna with layers corresponding to FIGS. 12A-12D with a patterned electrode micro-assembled on a component substrate according to illustrative embodiments of the present disclosure.

In some embodiments, the same micro-assembled inductor 99 can be a micro-assembled antenna 96 and can be connected at both ends of serially connected conductive functional layers 24 (e.g., by electrodes 32A, 32B as shown in FIG. 12F), or at only one end of serially connected functional layers 24 (e.g., by electrode 32A as shown in FIG. 12G).

Patterned functional-layer connectors 34 can be formed in a common step with common materials in a common layer (e.g., photolithographically defined metal layers) and are physically similar to electrodes 32. Electrodes 32 electrically connect exclusive subsets of print layers 20 to external circuits that can use stacked electronic components 90. Patterned functional-layer connectors 34, in contrast, are electrical connections between print layers 20 (e.g., between exposed conductive portions 25 of different print layers 20) in stack 80 and are not externally electrically connected. Because patterned functional-layer connectors 34 and electrodes 32 can be formed together in a common layer deposition and patterning process, they can be made efficiently and at relatively low cost. Thus, in some embodiments, each electrode 32 is electrically connected to an exposed conductive portion 25 of only one print layer 20 and, more generally, electrodes 32 electrically connect fewer than all of exposed conductive portions 25 of print layers 20. Moreover, in some embodiments, exposed conductive portions 25 of at least two print layers 20 are electrically connected by one or more patterned functional-layer connectors 34 that are electrically separate from one or more electrodes 32. Thus, functional-layer connectors 34 can electrically connect functional layers 24 in series and each functional-layer connector 34 can, but do not necessarily, directly electrically connect exposed conductive portions 25 of adjacent print layers 20. In some embodiments and as shown in FIGS. 10A-12F, electrode 32A is electrically connected to bottom print layer 20 (e.g., print layer 20 with the largest area at the bottom of stack 80) and electrode 32B is electrically connected to top print layer 20 (e.g., print layer 20 with the smallest area at the top of stack 80).

Functional layer 24 can be patterned in a variety of patterns corresponding to the desired functionality of stacked electronic component 90. For capacitive applications, each functional layer 24 can be a plate such as a polygon having an area filled with low-resistance conductive material, such as a metal, suitable for holding a charge and forming an electric or magnetic field between print layers 20. For resistive applications, each functional layer 24 can be a serpentine line or wire comprising a resistive material, such as polysilicon or a high-resistance metal or electrical conductor, suitable for conducting electrical current with a useful and defined resistance. Each end of the serpentine line can be disposed at an edge of dielectric layer 22 and electrically connected with functional layer connectors 34. For micro-assembled inductive or micro-assembled antenna 96 applications, each functional layer 24 can be a line or wire comprising a low-resistance conductive material, such as a metal, suitable for forming electrical or magnetic fields or responding to or forming electromagnetic radiation. The lines can be disposed around the perimeter of dielectric layer 22 (e.g., a polygon) and form one or more turns of a spiral in each print layer 20. In active circuits, functional layer 24 can comprise a layer of epitaxy, e.g., a semiconductor, or a semiconductor substrate patterned to form the active circuit, e.g., comprising transistors or diodes.

According to some embodiments of the present disclosure, print layers 20 are disposed (e.g., micro-transfer printed) onto component substrate 10 or onto another print layer 20 without an adhesive coated on component substrate 10 or other print layer 20, for example as shown in FIGS. 1A-12G. According to some embodiments and as illustrated in FIGS. 13-15, a layer of adhesive 60 can be disposed on component substrate 10 or print layer 20 before print layer 20 is transferred thereon. Adhesive 60 can be a resin, photoresist, an epoxy, or other adhesive, for example a polymer adhesive and can be curable, for example with heat or radiation, such as ultra-violet radiation. Adhesive 60 can be a non-conductive adhesive 60. Adhesive 60 can be disposed as a patterned layer (for example using an inkjet printer) or an unpatterned layer (for example using spray, curtain, or spin coating). The layer of adhesive 60 can be very thin, for example some nanometers or tens of nanometers thick, for example 30 nm or 50 nm thick. Adhesive 60 can be patterned, for example using photolithographic methods and materials.

FIG. 13 illustrates embodiments in which a layer of adhesive 60 is disposed between a first print layer 20 and component substrate 10 (or target substrate 50) and between each print layer 20, for example by spray coating. Print layers 20 of FIG. 13 comprise both bottom and top dielectric layer 22, 26 so that adhesive 60 adheres bottom dielectric layer 22 of a first print layer 20 to component substrate 10 (or target substrate 50) and top dielectric layer 26 of first print layer 20 to bottom dielectric layer 22 of a second print layer 20 adhered to first print layer 20 in a stack 80.

FIG. 14 illustrates embodiments in which a layer of adhesive 60 is disposed between a first print layer 20 and component substrate 10 and between each print layer 20. Print layers 20 of FIG. 14 comprise only a single dielectric layer 22 (e.g., no top dielectric layer 26 is present) so that adhesive 60 adheres dielectric layer 22 of a first print layer 20 to component substrate 10 and adheres functional layer 24 of first print layer 20 to dielectric layer 22 of an adjacent second print layer 20 in a stack 80. In such embodiments, if the layer of adhesive 60 is non-conductive, it can serve as top dielectric layer 26 for print layers 20, so that functional layers 24 are protected with a dielectric protection layer. Thus, adhesive 60 can be top dielectric layer 26 in print layer 20. In any case, dielectric layer 22 of second print layer 20 can protect functional layer 24 of first print layer 20, as second print layer 20 is disposed over first print layer 20.

In some embodiments, adhesive 60 can be sprayed over stack 80 after each print step for each print layer 20 without patterning. Adhesive 60 will accumulate with each repeated spraying until the final print layer 20 is disposed on the top of stack 80. The adhesive can then be cured, if desired, and exposed adhesive 60 removed. Thus, each print layer 20 in stack 80 is adhered to an adjacent print layer 20 with a non-conductive adhesive 60. Adhesive 60 removal can be a simple single unpatterned etch (e.g., a wet etch or dry etch, such as a plasma etch) that effectively removes exposed adhesive 60, leaving adhesive 60 between print layers 20 and component substrate 10 in place, and cleans exposed conductive portions 25. After adhesive 60 is removed, electrode layer 30 material can be disposed, e.g., by evaporation or sputtering, in an unpatterned layer and then patterned to form electrodes 32 using photolithographic patterning methods and materials.

As shown in the illustration of FIG. 15, according to some embodiments of the present disclosure, a stacked electronic component 90 can comprise a component substrate 10. Print layers 20 are disposed (e.g., by micro-transfer printing) in a stack 80 on component substrate 10. Component substrate 10, together with stack 80 of print layers 20 can be a micro-transfer printable component and comprise a component tether 18 (e.g., micro-assembled on component source wafer 76 as shown in FIG. 20). As shown in FIG. 15, component electrodes 36 can be disposed on component substrate 10 and electrically connect to electrodes 32 of stacked electronic component 90. Micro-assembled stacked electronic component 90 can be transfer printed onto target substrate 50, fracturing or separating component tether 18. Stacked electronic component 90 can be electrically connected to electrical devices or wires on target substrate 50.

Figure 16A:
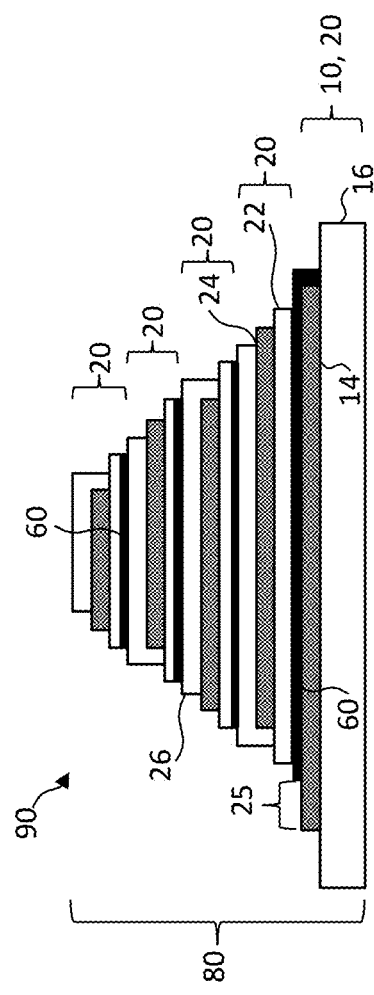
FIG. 16A is a cross section of a stacked electronic component comprising a component substrate and a component functional layer on a dielectric layer with layers of adhesive according to illustrative embodiments of the present disclosure.
Figure 16B:
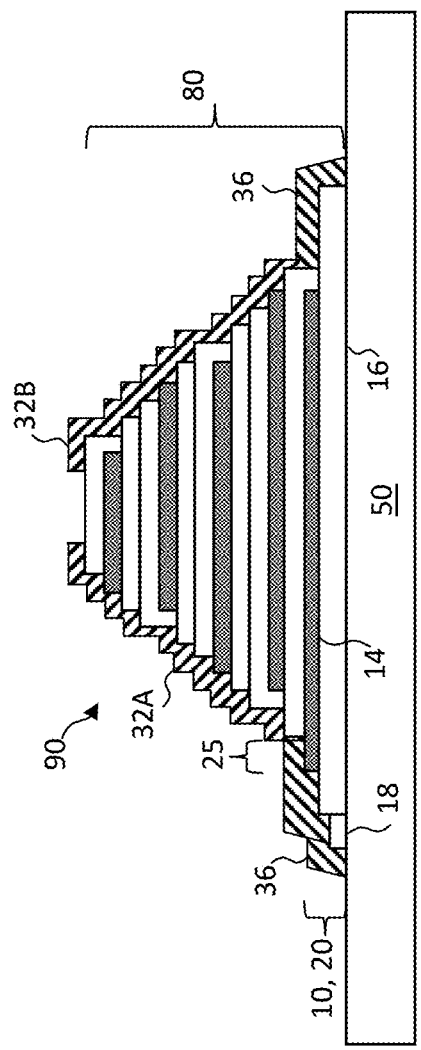
FIG. 16B is a cross section of a stacked electronic component comprising a component substrate and a component functional layer with electrodes according to illustrative embodiments of the present disclosure.

In some embodiments of the present disclosure and as shown in FIG. 16A, component substrate 10 can comprise a component functional layer 14 similar to functional layer 24 disposed on a component dielectric layer 16. Component functional layer 14 can comprise a component exposed conductive portion 25 that is not covered with a dielectric layer 22 of any of print layers 20 in stack 80. Thus, component substrate 10 can also be a print layer 20 and can form bottom print layer 20 of stack 80 so that component function layer 14 is also a functional layer 24 and component dielectric layer 16 is also dielectric layer 22 in a print layer 20. FIG. 16A illustrates a layer of adhesive 60 between print layers 20 and component functional layer 14. FIG. 16B illustrates a stack 80 of print layers 20 without layers of adhesive 60 on target substrate 50. Electrodes 32 and component electrode 36 electrically connect the exposed conductive portions 25.

Figure 16C:
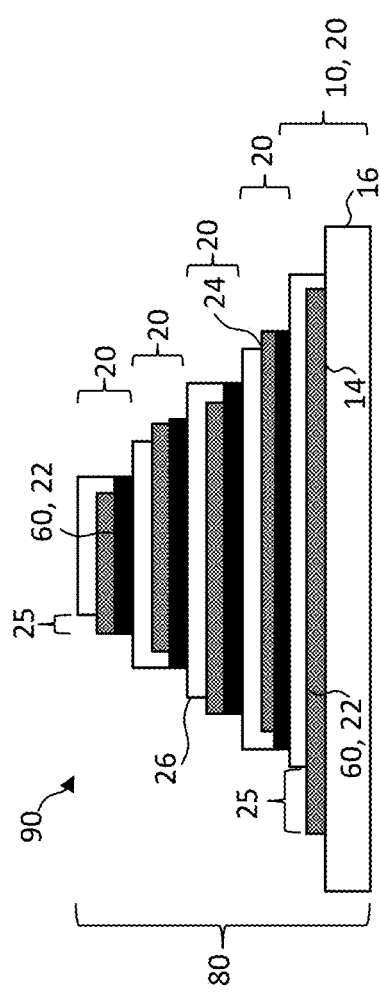
FIG. 16C is a cross section of a stacked electronic component comprising a component substrate and a component functional layer on a bottom adhesive dielectric layer with a top dielectric layer according to illustrative embodiments of the present disclosure.
Figure 16D:
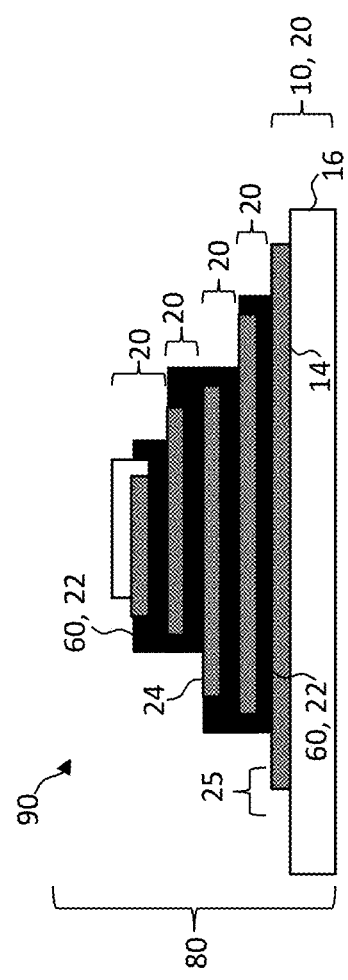
FIG. 16D is a cross section of a stacked electronic component comprising a component substrate and a component functional layer on an adhesive dielectric layer according to illustrative embodiments of the present disclosure.

As noted with respect to FIG. 14, layers of adhesive 60 can be top dielectric layer 26. As shown in FIG. 16C, layers of adhesive 60 can be bottom dielectric layer 22. This can be useful in cases in which functional layer 24 is an epitaxial or semiconductor substrate layer with a top dielectric layer 26 disposed on the semiconductor substrate (functional layer 24). The semiconductor substrate and top dielectric layer 26 can be transfer printed onto a layer of adhesive 60. Top dielectric layer 26 and the semiconductor substrate can be a mask for an otherwise unpatterned etch to remove adhesive 60 to expose conductive portions 25. As shown in FIG. 16D, layers of adhesive 60 can be bottom dielectric layer 22 and top dielectric layer 26. Again, this arrangement can be useful in cases in which functional layer 24 is an epitaxial or semiconductor substrate layer. However, in these embodiments, an external mask is useful to pattern-wise remove adhesive 60 to expose conductive portions 25 and leaving adhesive 60 remaining in place to protect portions of functional layer 24 (e.g., semiconductor substrate) from undesired electrical connection to electrodes 32.

According to embodiments of the present disclosure, functional layers 24 can comprise metals, such as copper or aluminum, or metal alloys, and can have a thickness of 100 nm to 5 microns, for example 500 nm to one micron.

Dielectric layers 22 can have a thickness of one micron to 10 microns, for example 2-5 microns and can be an inorganic dielectric, such as silicon dioxide or silicon nitride or can be an organic dielectric with a thickness less than one micron. Top dielectric layers 26 can have a thickness less than the thickness of bottom dielectric layers 22, for example having a thickness of one micron to 4 microns, and can be an inorganic dielectric, such as silicon dioxide or silicon nitride, or an organic dielectric, such as a polymer or adhesive with a thickness less than one micron.

Embodiments of the present disclosure provide stacked electronic components 90 with relatively large functional parameters constructed with a simple manufacturing process and reduced resolution requirements. Electrodes 32 can be relatively thick, have good electrical conductivity, and can have a relatively low resolution. Patterned electrode layer 30 (e.g., electrodes 32) can cover no less than 5%, 10%, 20%, 50%, 70%, 80%, or 90% of an area of stacked electronic component 90, providing excellent conductivity and thermal dissipation. Stacked electronic components 90 can be micro-components, for example having an area no greater than 40,000 $\mu m^2$ (e.g., 200 by 200 microns), no greater than 10,000 $\mu m^2$ (e.g., 100 by 100 microns), 2,500 $\mu m^2$ (e.g., 50 by 50 microns), or 400 $\mu m^2$ (e.g., 20 by 20 microns). Since each print layer 20 can be relatively thin (e.g., 1 micron, 2 microns, 5 microns, or 10 microns), stack 80 can comprise 4 or more print layers 20, 8 or more print layers 20, 12 or more print layers 20, 15 or more print layers 20, 20 or more print layers 20, or 50 or more print layers 20, and a thickness of each print layer 20 can be no greater than 2 microns, no greater than 5 microns, or no greater than 10 microns. A thickness of stack 80 can be no greater than 10 microns, no greater than 15 microns, no greater than 20 microns, no greater than 50 microns, or no greater than 100 microns.

Figure 17:
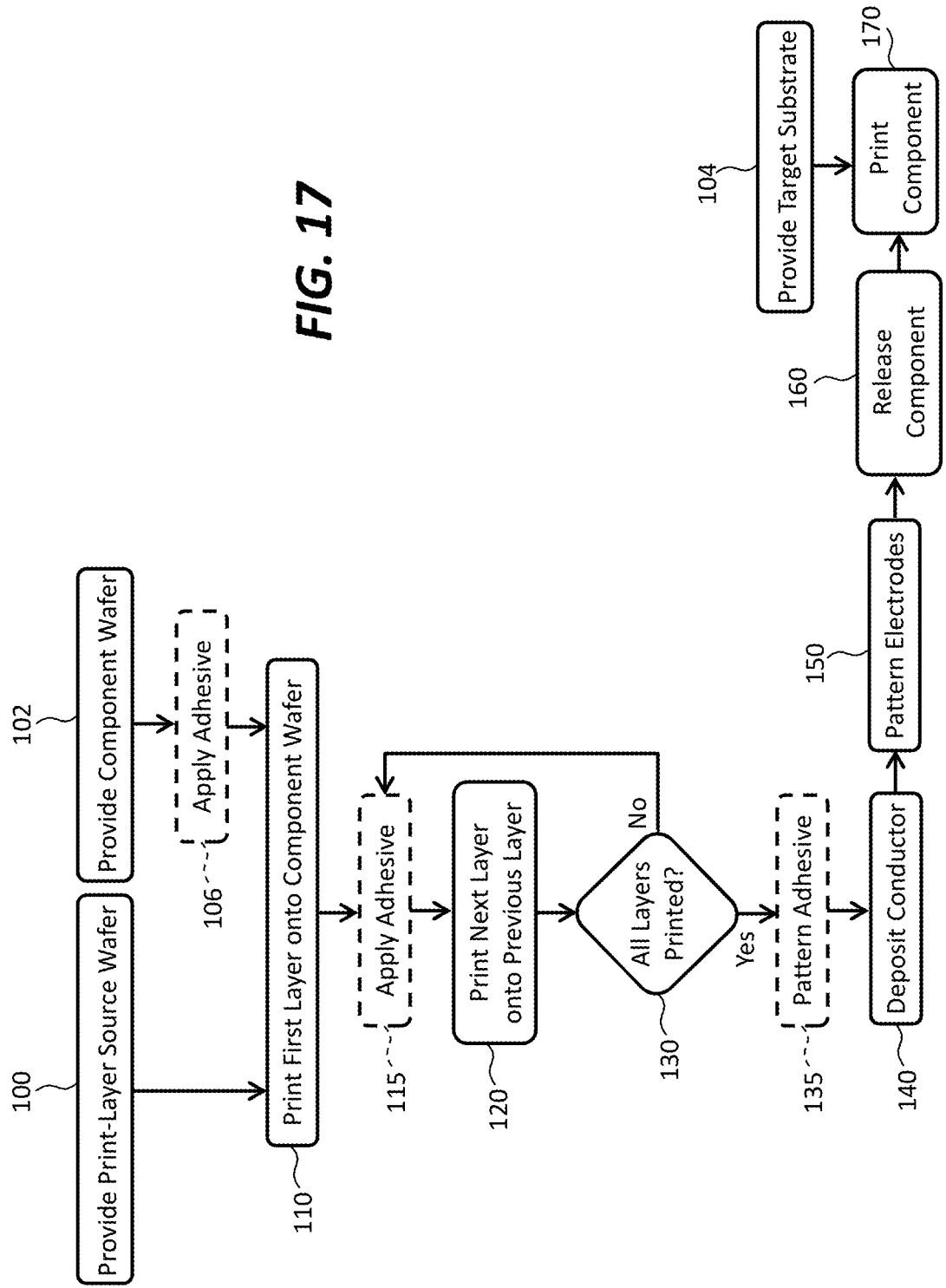
FIGS. 17 and 18 are flow diagrams illustrating methods of the present disclosure.

As shown in FIG. 17, according to the present disclosure, methods of making a stacked electronic component 90 comprise providing one or more print-layer source wafers 70 comprising print layers 20 in step 100, for example as shown in FIGS. 1A-1D and 19, and providing a component source substrate 76 (e.g., a component source wafer 76) in step 102 and as shown in FIG. 20. Print layers 20 on a print-layer source wafer 70 can have a common area or have different areas as shown in FIGS. 1A-1D and 19. Thus, a single print-layer source wafer 70 can be a single, common print-layer source wafer 70 for all print layers 20, or multiple different or same print-layer source wafers 70 can be used. Optionally, a layer of adhesive 60 is disposed on component source substrate 76 in step 106. A first print layer 20 is transfer printed from one of print-layer source wafers 70 onto component source substrate 76 in step 110. Optionally, in step 115, adhesive 60 is disposed on first print layer 20. In step 120, a second print layer 20 is transfer printed from a print-layer source wafer 70 (e.g., the same print-layer source wafer 70 that provided first print layer 20 or a different print-layer source wafer 70) onto the first print layer 20 to form a stack 80 of print layers 20. Second print layer 20 has a smaller area over component source substrate 76 than first print layer 20. In embodiments, second print layer 20 is completely and entirely disposed directly over first print layer 20 and does not extend over an edge of first print layer 20. Second print layer 20 can be a next print layer 20 and, if additional print layers 20 are desired in stack 80 (step 130), step 120 is repeated with a next print layer 20, optionally with adhesive in step 115, so that next print layer 20 is disposed on the immediately previous print layer 20 by transfer printing next print layer 20 from a print-layer source wafer 70 to the top of stack 80 of print layers 20. Thus, methods of the present disclosure comprise successively transfer printing print layers 20 having successively smaller areas from a print-layer source wafer 70 onto stack 80 to increase the number of print layers 20 in stack 80.

Each functional layer 24 comprises an exposed conductive portion 25 that is not covered with a dielectric layer 22 of any of print layers 20. In some embodiments, print layers 20 on a print-layer source wafer 70 are oriented in a common direction but are rotated during the transfer printing process, e.g., by a stamp on a motion-control platform for transfer printing, to orient print layers 20 in different directions, for example on different sides of stack 80, to locate exposed conductive portions 25 on the different sides (edges) of stack 80, simplifying the pattern of electrodes 32.

Each print layer 20 comprises a dielectric layer 22 and a functional layer 24 disposed on dielectric layer 22. Each functional layer 24 comprises an exposed conductive portion 25 that is not covered with a dielectric layer 22 of any print layers 20 in stack 80. Thus, second print layer 20 (e.g., next print layer 20) has a smaller area than the first print layer (e.g., print layers 20 beneath the next print layer 20 in stack 80). Each exposed conductive portion 25 is spatially separated from any other exposed conductive portion 25 in a direction orthogonal to stack 80, e.g., each exposed conductive portion 25 is horizontally separated by a spatial separation S in horizontal direction H from every other exposed conductive portion 25. Spatial separation S can be zero so that two exposed conductive portions 25 can abut or border on each other but cannot overlap, e.g., are nonoverlapping exposed conductive portions 25.

After stack 80 of print layers 20 is completed, in optional step 135, as shown in FIGS. 1E and 1F, any adhesive 60, if present, is removed, e.g., by exposure to an energetic plasma that can remove organic materials such as polymeric adhesives 60, thus clearing exposed conductive portions 25. Electrode layer 30 (an electrical conductor) is deposited in step 140 as shown in FIG. 1G, for example by evaporation or sputtering a metal or other electrically conductive material as an unpatterned coating over stack 80. The electrode layer 30 is patterned in step 150 to form electrodes 32, for example by photolithographic methods and materials. Stacked electronic component 90 is then complete, for example as shown in FIGS. 1H and 1I.

In some embodiments of the present disclosure, stack 80 of print layers 20 (e.g., stacked electronic component 90) is disposed on a component substrate 10, e.g., as shown in FIGS. 1E and 1F. In some embodiments, component substrate 10 is originally disposed on a component source wafer 76 (e.g., as shown in FIG. 20) and the entire stacked electronic component 90 (e.g., comprising stack 80 of print layers 20 and component substrate 10) is released from component source wafer 76 in step 160 and transfer printed (e.g., micro-transfer printed with a stamp in a motion platform) from component source wafer 76 to a target substrate 50 provided in step 104 in step 170, for example as shown in FIGS. 15 and 16B.

Figure 18:
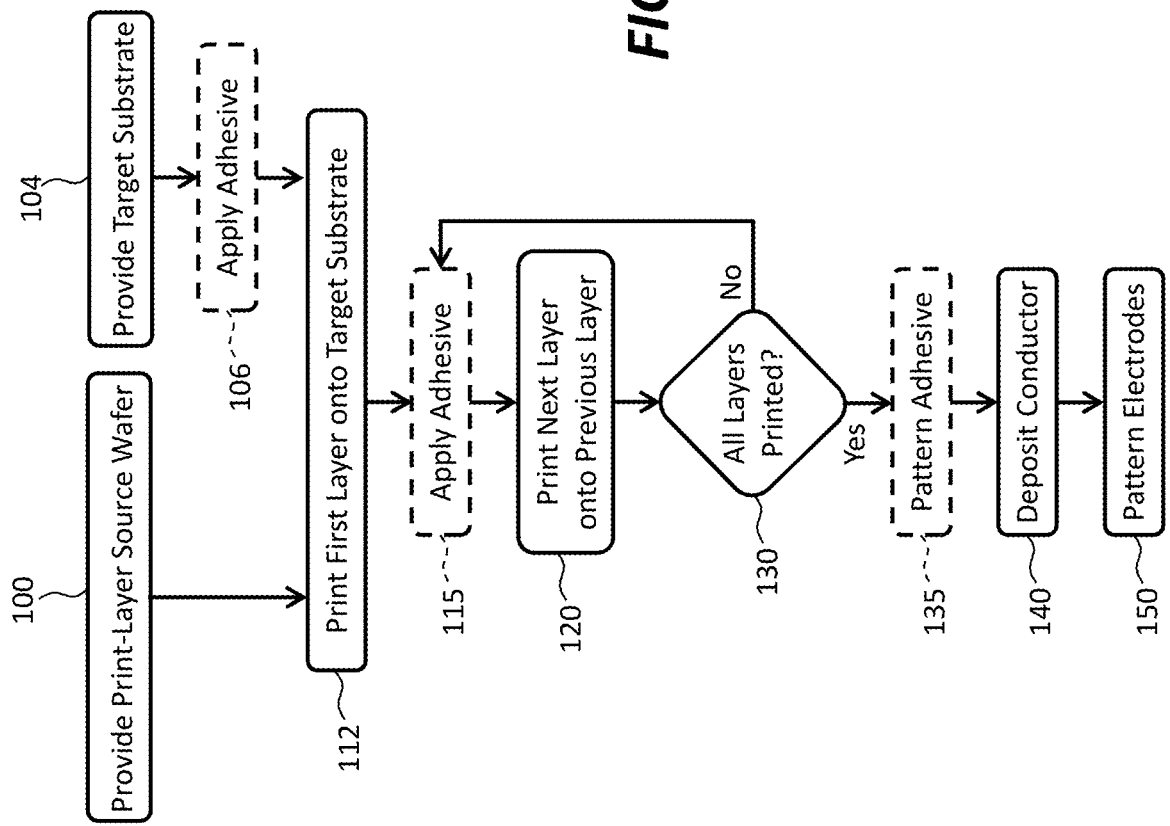

In some embodiments, component substrate 10 is a final substrate (e.g., is also a target substrate 50) with other electrical components or circuits disposed thereon to make a final electronic system for an application. As shown in FIG. 18, in some such embodiments, methods of making a stacked electronic component 90 comprise providing one or more print-layer source wafers 70 comprising print layers 20 in step 100 and as shown in FIGS. 1A-1D, 19 and providing a target substrate 50 in step 104. Optionally, a layer of adhesive 60 is disposed on target substrate 50 in step 106. A first print layer 20 is transfer printed from one of print-layer source wafers 70 onto target substrate 50 in step 112. Optionally, in step 115, adhesive 60 is disposed on first print layer 20. In step 120, a second print layer 20 is transfer printed from a print-layer source wafer 70 (e.g., the same print-layer source wafer 70 that provided first print layer 20 or a different print-layer source wafer 70) onto first print layer 20 to form a stack 80 of print layers 20. Second print layer 20 has a smaller area over target substrate 50 than first print layer 20. In embodiments, second print layer 20 is completely and entirely disposed directly over first print layer 20 and does not extend over an edge of first print layer 20. Second print layer 20 can be a next print layer 20 and, if additional print layers 20 are desired in stack 80 (step 130), step 120 is repeated with a next print layer 20 so that next print layer 20 is disposed on the immediately previous print layer 20 by transfer printing next print layer 20 from a print-layer source wafer 70 to the top of stack 80 of print layers 20. Thus, methods of the present disclosure comprise successively transfer printing print layers 20 having successively smaller areas from a print-layer source wafer 70 onto stack 80 to increase the number of print layers 20 in stack 80. Each functional layer 24 comprises an exposed conductive portion 25 that is not covered with a dielectric layer 22 of any of print layers 20. In some embodiments, print layers 20 on a print-layer source wafer 70 are oriented in a common direction but are rotated during the transfer printing process, e.g., by a stamp on a motion-control platform for transfer printing, to orient print layers 20 in different directions, for example on different sides of stack 80, to locate exposed conductive portions 25 on the different sides of stack 80, simplifying the pattern of electrodes 32. Once all of print layers 20 are disposed in stack 80 (step 130), in step 135 any adhesive 60, if present, is removed, e.g., by exposure to an energetic plasma that can remove organic materials such as polymeric adhesives 60, thus clearing exposed conductive portions 25, for example as shown in FIG. 13. Electrode layer 30 (an electrical conductor) is deposited in step 140, for example by evaporation or sputtering a metal or other electrically conductive material as an unpatterned coating over stack 80, for example as shown in FIG. 1G. Electrode layer 30 is patterned in step 150 to form electrodes 32, for example by photolithographic methods and materials. Stacked electronic component 90 is then complete and disposed on target substrate 50 and can be electrically interconnected with other electronic or opto-electronic components in a system.

In some methods of the present disclosure, stack 80 is coated with unpatterned insulating layer 40 and patterned to form vias 44 in patterned insulating layer 42 that expose exposed conductive portions 25. Some methods of the present disclosure comprise coating stack 80 with an electrode layer 30 and patterning electrode layer 30 to define one or more electrodes 32, each electrode 32 in electrical contact with an exclusive subset of exposed conductive portions 25. According to some methods, patterning electrode layer 30 comprises forming functional-layer connectors 34 that each electrically connect exposed conductive portions 25 of at least two print layers 20 and are electrically separate from electrodes 32 so that electrodes 32 electrically connect fewer than all of exposed conductive portions 25.

Figure 21:
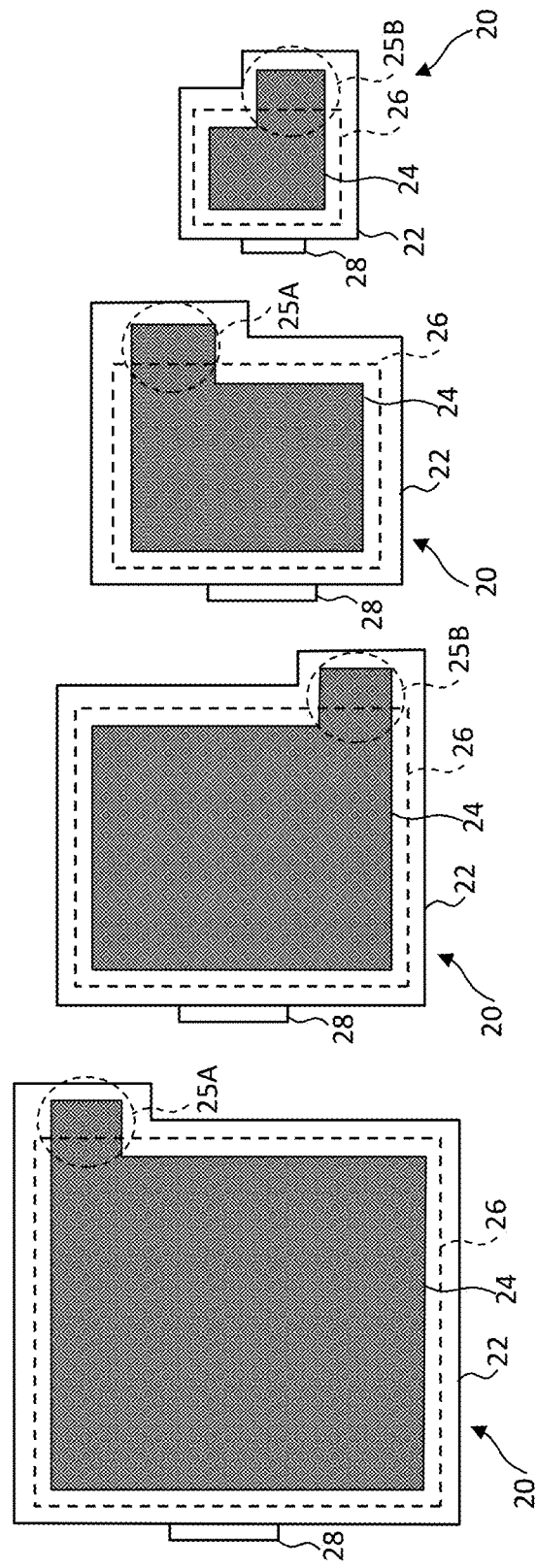
FIG. 21 is a plan view of different-area print layers with tabs of a micro-assembled component according to illustrative embodiments of the present disclosure.

In embodiments according to FIG. 21, dielectric layer 22 of print layers 20 can have a rectangular shape with a tab extending from the rectangular area and exposed conductive portion 25 (e.g., exposed conductive portions 25A, 25B) can be disposed on the tabs. Such an arrangement can simplify the structure of top dielectric layer 26 or electrodes 32, particularly if unpatterned layers of adhesive 60 are disposed, for example by spray coating. The tabs can provide a useful masking effect for material deposition.

Embodiments of the present disclosure describe passive stacked electronic components 90 (e.g., micro-assembled capacitor 97, micro-assembled resistor 98, micro-assembled inductor 99, or micro-assembled antenna 96) comprising stacks 80 of passive print layers 20 for which the term electronic includes an electrical conductor used in an electronic circuit or system and does not imply that stacked electronic components 90 are active components, for example comprising a transistor.

According to some embodiments of the present disclosure and as shown in active print layer 20 of FIG. 22, an active stacked electronic component 95 comprises a stack 80 of active print layers 20. Each print layer 20 in stack 80 has an area less than any print layers 20 beneath print layer 20 in stack 80. Each print layer 20 comprises a dielectric layer 22 and an epitaxial layer 23 (that is a functional layer 24) disposed on or in dielectric layer 22. Epitaxial layer 23 comprises an exposed conductive portion 25 that is not covered with a dielectric layer 22 of any of active print layers 20, and each exposed conductive portion 25 is non-overlapping with any other exposed conductive portion 25. Epitaxial layer 23 can be a semiconductor substrate with a process surface and can comprise an active circuit 29 formed in or on the process surface, for example comprising transistors or diodes. A top dielectric layer 26 can be disposed over epitaxial layer 23. Dielectric layer 22 can be a layer of adhesive 60 on which epitaxial layer 23 (e.g., a semiconductor substrate) is disposed (e.g., by micro-transfer printing a semiconductor substrate onto layer of adhesive 60) when functional layer 24 is epitaxial layer 23. A patterned electrode layer 30 is coated on at least a portion of stack 80, patterned electrode layer 30 defining one or more electrodes 32. Each electrode 32 is in electrical contact with an exclusive subset of exposed conductive portions 25. In some embodiments, passive print layers 20 are interspersed between active print layers 20 in stack 80, for example providing both active stacked electronic components 90 and passive stacked electronic components 90 in a common stack 80.

Active circuit 29 can comprise electronic circuitry, structures, and materials, for example electrical conductors, vias, doped semiconductors formed using lithographic processes. The circuits can include insulating layers and structures such as silicon dioxide, nitride, and passivation layers and functional layers or structures including wires or circuit electrodes made of aluminum, titanium, silver, or gold that form an electronic circuit. Useable methods and materials for making electronic circuits are known in the integrated circuit arts.

In some embodiments of the present disclosure, active stacked electronic components 95 comprise active print layers 20 (e.g., comprising an epitaxial layer 23 with active elements such as transistors) and passive print layers 20 (e.g., forming capacitor plates, resistor wires, or inductor wires). Moreover, a single stack 80 can comprise different types of active or passive functional layers 24 and can make multiple different electronic components in the common stack 80. For example, in a single stack 80 some print layers 20 can provide resistors, some print layers 20 can provide capacitors, and some print layers 20 can provide active elements to form a functionally heterogeneous stacked electronic component 90 electrically connected with functional-layer connectors 34. In general, functional-layer connectors 34 can connect any print layers 20 in stack 80 in any order in series or in parallel to form the desired stacked electrical component 90.

According to some embodiments of the present disclosure, and as shown in FIG. 23, target substrate 50 (or component substrate 10) is a semiconductor substrate with a target substrate active circuit 52 (or component active circuit 52) and target substrate contact pads 56 formed in or disposed thereon and stacked electronic component 90 is disposed over target substrate active circuit 52 and electrically connected to target substrate active circuit 52 with target substrate electrodes 54 (e.g., corresponding to component electrodes 36) and target substrate contact pads 56, to form a three-dimensional integrated circuit. This structure enables an efficient and highly integrated electronic system incorporating active and passive electronic components.

The use of transfer printing (e.g., micro-transfer printing) reduces construction costs. If print layers 20 are serially constructed using photolithography to form stack 80, the materials in each print layer 20 must be successively deposited and patterned, relatively slowly and at significant expense. In contrast, forming all of print layers 20 on print-layer source wafer 70 in a common step greatly reduces the amount of photolithographic processing necessary. Since the transfer printing steps can be done massively in parallel (e.g., 10,000 to 100,000 print layers 20 per transfer, where each transfer takes only a fraction of a minute), costs and processing time are much reduced.

Stacked electronic components 90 can be very small (e.g., having a length and a width no greater than 200 microns (for example, no greater than 100 microns, no greater than 50 microns, no greater than 20 microns, or no greater than 10 microns) and a thickness no greater than 50 microns (for example no greater than 30 microns, no greater than 20 microns, no greater than 10 microns, or no greater than five microns). Each print layer 20 can be very thin, for example one micron, two microns, or five microns thick. Despite the small size, the functional performance of stack 80 of stacked electronic components 90 is increased by an approximate multiple of the number of print layers 20 in stack 80. In certain embodiments, stacked electronic components 90 of the present disclosure can be micro-transfer printed. Micro-transfer printing can transfer very small components (e.g., integrated circuit chiplets) from a source wafer to a target substrate 50. Other methods, such as pick-and-place or surface-mount techniques cannot transfer such small stacked electronic components 90. Because the stacked electronic components 90 are relatively small, they can be disposed directly on a semiconductor die or adjacent to an unpackaged semiconductor die. The semiconductor die can be, for example, an integrated circuit such as a CMOS circuit.

Target substrates 50 can be any suitable substrate on which an electronic or opto-electronic circuit can be constructed or disposed and can be a glass, polymer, ceramic, quartz, or semiconductor substrate. Target substrate 50 can be a semiconductor wafer and circuits can be disposed on target substrate 50 by transfer printing or can be natively formed in situ, for example as CMOS, digital, mixed signal, or analog circuits in an epitaxial layer of a semiconductor wafer. Electrical target substrate contact pads 56 and target substrate electrodes 54 can be provided on target substrate 50 that are electrically connected to electrodes 32 or component electrodes 36, for example by photolithographic or printed circuit board methods and materials.

In some embodiments of the present disclosure, a component source wafer 76 or print-layer source wafer 70 and sacrificial portion 72 include various materials. In some embodiments, component source wafer 76 or print-layer source wafer 70 is anisotropically etchable (for example silicon {1 1 1}) and each sacrificial portion 72 is a designated portion of component source wafer 76 or print-layer source wafer 70. In some embodiments, each sacrificial portion 72 comprises sacrificial material (e.g., silicon dioxide) that is differentially etchable from component source wafer 76 or print-layer source wafer 70. In some embodiments, sacrificial portion 72 is etched forming a gap between print layer 20 and print-layer source wafer 70 or between stack 80 and component source wafer 76 made by etching sacrificial portion 72, for example with a wet etchant such as TMAH or KOH.

According to various embodiments of the present invention, native source wafers can be provided with print layers 20, sacrificial portion 72, component substrates 10, and component tethers 18 or print-layer tethers 28 already formed, or they can be constructed as part of a process in accordance with some embodiments of the present invention.

Target substrates 50, print-layer source wafers 70 (print-layer source substrates), component source wafers 76, transfer-print stamps, and motion control platforms for micro-transfer printing can be made separately and at different times or in different temporal orders or locations and provided in various process states.

For a discussion of micro-transfer printing techniques applicable to (e.g., adaptable to or combinable with) methods disclosed herein see U.S. Pat. Nos. 8,722,458, 7,622,367 and 8,506,867. Additional details useful in understanding and performing aspects of the present disclosure are described in U.S. Patent Application Ser. No. 62/148,603 filed Apr. 16, 2015, entitled Micro Assembled Micro LED Displays and Lighting Elements and in U.S. Patent Application Ser. No. 62/055,472 filed Sep. 25, 2014, entitled Compound Micro-Assembly Strategies and Devices, the disclosure of each of which is hereby incorporated herein in its entirety by reference.

Tethers that are usable with, adaptable for use in, or combinable with tethers disclosed herein are discussed in U.S. Patent Publication No. 2019/0385885 filed Jun. 14, 2018, entitled Multi-Layer Tethers for Micro-Transfer-Printing, and U.S. Pat. No. 10,714,374 filed May 9, 2019, entitled High-Precision Printed Structures, whose contents are incorporated herein by reference.

As is understood by those skilled in the art, the terms "over" and "under", "above" and "below", "top" and "bottom" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously.

Having expressly described certain embodiments, it will now become apparent to one of skill in the art that other embodiments incorporating the concepts of the disclosure may be used. Therefore, the claimed invention should not be limited to the described embodiments, but rather should be limited only by the spirit and scope of the following claims.

PARTS LIST

D stack direction/vertical direction
H horizontal direction
S spatial separation
X x direction/x dimension
Y y direction/Y dimension
10 component substrate
12 alignment structure
14 component functional layer
16 component dielectric layer
18 component tether
20 print layer
22 dielectric layer/bottom dielectric layer/dielectric substrate
23 epitaxial layer
24, 24A, 24B functional layer
25, 25A, 25B exposed conductive portion
26 dielectric layer/top dielectric layer
28 print-layer tether
29 active circuit
30 electrode layer
32, 32A, 32B electrode
34 functional-layer connector
36 component electrode
40 unpatterned insulating layer
42 patterned insulating layer
44 via
50 target substrate
52 target substrate active circuit/component active circuit
54 target substrate electrode
56 target substrate contact pad
60 adhesive
70 print-layer source wafer
72 sacrificial portion
74 anchor
76 component source wafer/component source substrate
80 stack
90 stacked electronic component
95 stacked active electronic component/micro-assembled integrated circuit
96 stacked passive electronic component/micro-assembled antenna
97 stacked passive electronic component/micro-assembled capacitor
98 stacked passive electronic component/micro-assembled resistor
99 stacked passive electronic component/micro-assembled inductor
100 provide print-layer source wafer step
102 provide component source wafer step
104 provide target substrate step
106 optional pattern adhesive step
110 print first layer onto component wafer step
112 print first layer onto target substrate step
115 optional apply adhesive step
120 print next layer onto previous layer step
130 all layers printed step
135 optional pattern adhesive step
140 deposit conductor step
150 pattern electrodes step
160 release component step
170 print component step

What is claimed is:

1. A method of making a stacked electronic component, comprising:
providing one or more print-layer source wafers each comprising multiple print layers, each of the print layers comprising a dielectric layer and a functional layer disposed on the dielectric layer, each functional layer comprising an exposed conductive portion that is not covered with a dielectric layer of any of the print layers;
providing a component source substrate;
transfer printing a first print layer from one of the one or more print-layer source wafers onto the component source substrate;
transfer printing a second print layer from one of the one or more print-layer source wafers onto the first print layer to form a stack of print layers;
transfer printing a third print layer from one of the one or more print-layer source wafers onto the second print layer thereby increasing the number of print layers in the stack of print layers;
after printing the third print layer onto the stack of print layers, coating the stack of print layers with an electrode layer; and
patterning the electrode layer to define one or more electrodes, the one or more electrodes in electrical contact with each exposed conductive portion of an exclusive subset of the print layers in the stack to make the stacked electronic component,
wherein the second print layer has a smaller area than the first print layer and the third print layer has a smaller area than the second print layer and each exposed conductive portion of the print layers in the stack is nonoverlapping with any other exposed conductive portion.

2. The method of claim 1, further comprising successively transfer printing print layers having successively smaller areas from a print-layer source wafer of the one or more print-layer source wafers onto the stack to increase the number of print layers in the stack, wherein each functional layer comprises the exposed conductive portion that is not covered with the dielectric layer of any of the print layers.

3. The method of claim 1, wherein the one or more print-layer source wafers are a single, common print-layer source wafer.

4. The method of claim 1, further comprising rotating the second print layer with respect to the first print layer while transfer printing the second print layer onto or over the first print layer.

5. The method of claim 1, wherein the method further comprises providing a target substrate and transfer printing the stacked electronic component to the target substrate.

6. The method of claim 1, further comprising coating the electrode layer with an insulating layer and forming vias in the insulating layer to expose the exposed conductive portions.

7. The method of claim 1, wherein patterning the electrode layer comprises forming a functional-layer connector that electrically connects the exposed conductive portions of at least two print layers in the stack and is physically and spatially separate from the one or more electrodes so that the one or more electrodes electrically connect fewer than all of the exposed conductive portions in the stack.

* * * * *